(12) United States Patent
Fukutomi et al.

(10) Patent No.: US 8,031,324 B2
(45) Date of Patent: Oct. 4, 2011

(54) SUBSTRATE PROCESSING APPARATUS WITH INTEGRATED CLEANING UNIT

(75) Inventors: Yoshiteru Fukutomi, Kyoto (JP); Masami Ohtani, Kyoto (JP)

(73) Assignee: Sokudo Co., Ltd., Kyoto (JP)

(*) Notice: Subject to any disclaimer, the term of this patent is extended or adjusted under 35 U.S.C. 154(b) by 751 days.

(21) Appl. No.: 12/031,667

(22) Filed: Feb. 14, 2008

(65) Prior Publication Data

US 2008/0198341 A1 Aug. 21, 2008

(30) Foreign Application Priority Data

Feb. 15, 2007 (JP) .................. 2007-034197

(51) Int. Cl.
*G03B 27/52* (2006.01)
*G03D 5/00* (2006.01)

(52) U.S. Cl. .............. 355/27; 355/30; 396/611

(58) Field of Classification Search .......... 355/27, 355/30; 396/611
See application file for complete search history.

(56) References Cited

U.S. PATENT DOCUMENTS

| | | | |
|---|---|---|---|
| 6,264,748 B1 | 7/2001 | Kuriki et al. | |
| 6,874,515 B2 * | 4/2005 | Ishihara et al. | 134/140 |
| 6,893,171 B2 | 5/2005 | Fukutomi et al. | |
| 7,641,405 B2 | 1/2010 | Fukutomi | |
| 2001/0037858 A1 * | 11/2001 | Taniyama et al. | 156/345 |
| 2006/0039431 A1 | 2/2006 | Sekiguchi et al. | |
| 2006/0045722 A1 | 3/2006 | Hashimoto | |
| 2006/0108665 A1 | 5/2006 | Kurokawa et al. | |
| 2006/0291855 A1 * | 12/2006 | Shigemori et al. | 396/611 |
| 2007/0190437 A1 | 8/2007 | Kaneyama | |
| 2008/0196658 A1 | 8/2008 | Fukutomi et al. | |
| 2008/0212049 A1 | 9/2008 | Fukutomi et al. | |

FOREIGN PATENT DOCUMENTS

| | | |
|---|---|---|
| JP | 2000-164671 A | 6/2000 |
| JP | 2000-223460 | 8/2000 |
| JP | 2003-324139 | 11/2003 |
| JP | 2004-010961 A | 1/2004 |
| JP | 2004-052108 A | 2/2004 |
| JP | 2006-012880 | 1/2006 |
| JP | 2006-032691 | 2/2006 |
| JP | 2006-147911 | 6/2006 |
| JP | 2007-214365 | 8/2007 |
| JP | 2007-235089 | 9/2007 |
| KR | 10-1999-0023624 A | 3/1999 |
| KR | 10-2000-0035698 A | 6/2000 |
| WO | WO 99/49504 | 9/1999 |
| WO | WO 2006/027900 | 3/2006 |
| WO | WO 2006/028173 | 3/2006 |

OTHER PUBLICATIONS

Decision to Grant a Patent, mailed Dec. 15, 2009, 2 page total.

* cited by examiner

*Primary Examiner* — Hung Henry Nguyen
*Assistant Examiner* — Steven H Whitesell-Gordon
(74) *Attorney, Agent, or Firm* — Kilpatrick Townsend & Stockton LLP

(57) ABSTRACT

In a substrate processing apparatus, an indexer block, a resist film processing block, a cleaning/drying processing block, a development processing block, and an interface block are provided side by side in this order. An exposure device is arranged adjacent to the interface block. The exposure device subjects a substrate to exposure processing by means of a liquid immersion method. Substrate platforms are provided in close proximity one above the other between the cleaning/drying processing block and the development processing block for receiving and transferring the substrate therebetween. Reversing units that reverse one surface and the other surface of the substrate are respectively stacked above and below the substrate platforms.

8 Claims, 12 Drawing Sheets

SUBSTRATE PROCESSING APPARATUS WITH INTEGRATED CLEANING UNIT

CROSS-REFERENCES TO RELATED APPLICATIONS

This application claims priority to Japanese Patent Application 2007-034197, filed Feb. 15, 2007. The disclosure of JP 2007-034197 is hereby incorporated by reference in its entirety for all purposes.

BACKGROUND OF THE INVENTION

The present invention relates to a substrate processing apparatus that subjects substrates to processing.

Substrate processing apparatuses are used to subject various types of substrates such as semiconductor substrates, substrates for liquid crystal displays, plasma displays, optical disks, magnetic disks, magneto-optical disks, and photomasks, and other substrates to various types of processing.

Such a substrate processing apparatus generally subjects a single substrate to a plurality of different types of processing successively (see, for example, JP 2003-324139). The substrate processing apparatus as described in JP 2003-324139 includes an indexer block, an anti-reflection film processing block, a resist film processing block, a development processing block, and an interface block. An exposure device is arranged adjacent to the interface block as an external device separate from the substrate processing apparatus.

In the above-mentioned substrate processing apparatus, a substrate carried out of the indexer block is transported to the exposure device through the interface block after being subjected to anti-reflection film formation and resist film coating processing in the anti-reflection film processing block and the resist film processing block. After a resist film on the substrate is subjected to exposure processing in the exposure device, the substrate is transported to the development processing block through the interface block. After the resist film on the substrate is subjected to development processing to form a resist pattern thereon in the development processing block, the substrate is transported to the indexer block.

With recent increases in density and integration of devices, making finer resist patterns has become an important problem. Conventional exposure devices have generally performed exposure processing by reduction-projecting reticle patterns on substrates through projection lenses. With such conventional exposure devices, however, the line widths of exposure patterns are determined by the wavelengths of light sources of the exposure devices. Therefore, making finer resist patterns have had limitations.

Therefore, a liquid immersion method is suggested as a projection exposure method allowing for finer exposure patterns (see, for example, WO99/49504 pamphlet). In a projection exposure device according to the WO99/49504 pamphlet, an area between a projection optical system and a substrate is filled with a liquid, resulting in a shorter wavelength of exposure light on a top surface of the substrate. This allows for finer exposure patterns.

When the substrate is subjected to the exposure processing by means of the liquid immersion method disclosed in the above-mentioned WO99/49504 pamphlet, however, a contaminant that adheres to a back surface of the substrate is mixed into the liquid within the exposure device if the back surface of the substrate is contaminated. Thus, a lens of the exposure device is contaminated, resulting in a defective dimension and a defective shape of an exposure pattern.

Furthermore, when the substrate after the exposure processing is carried out of the exposure device, and the back surface of the substrate carried into a development processing block is contaminated, development problems may occur. Thus, there is a need in the art for improved methods and systems for substrate processing.

SUMMARY OF THE INVENTION

An object of the present invention is to provide a substrate processing apparatus in which processing troubles due to contamination in a substrate before or after exposure processing are prevented with throughput inhibited from being reduced and that can be miniaturized.

According to an aspect of the present invention, a substrate processing apparatus that is arranged adjacent to an exposure device and processes a substrate having a top surface and a back surface includes a processing section for subjecting the substrate to predetermined processing and an interface for receiving and transferring the substrate between the processing section and the exposure device. The processing section includes a first processing unit, a second processing unit, and a third processing unit.

The first processing unit has a photosensitive film formation region and a first transport region. The photosensitive film formation region is provided with a photosensitive film formation unit that forms a photosensitive film composed of a photosensitive material on the substrate that has not been subjected to exposure processing by the exposure device. The first transport region is provided with a first transport unit that transports the substrate.

The second processing unit has a cleaning region and a second transport region. The cleaning region is provided with a top surface cleaning unit that cleans the top surface of the substrate and a back surface cleaning unit that cleans the back surface of the substrate. The second transport region is provided with a second transport unit that transports the substrate.

The third processing unit has a development processing region and a third transport region. The development processing region is provided with a development unit that subjects the substrate after the exposure processing by the exposure device to development processing. The third transport region is provided with a third transport unit that transports the substrate.

A first placement unit on which the substrate transported by the first and second transport units can be placed is provided between the first processing unit and the second processing unit. A second placement unit on which the substrate transported by the second and third transport units can be placed is provided between the second processing unit and the third processing unit. A reversing unit that reverses one surface and the other surface of the substrate carried thereinto by the second transport unit is stacked on at least one of the first and second placement units.

In the substrate processing apparatus, the processing section subjects the substrate to the processing. The substrate that has been subjected to the processing is transferred to the interface. The interface carries the substrate that has been transferred from the processing section into the exposure device. Thus, the exposure device subjects the substrate to the exposure processing. The substrate after the exposure processing is carried out of the exposure device, and is transferred to the interface. The interface carries the substrate that has been transferred from the exposure device into the processing section.

In the first processing unit, the second processing unit, and the third processing unit within the processing section, the substrate is transported by the first transport unit, the second transport unit, and the third transport unit, respectively. The substrate transported between the first and second processing units is placed on the first placement unit. The substrate transported between the second and third processing units is placed on the second placement unit.

In the first processing unit, the photosensitive film formation unit forms the photosensitive film on the substrate before the exposure processing by the exposure device. In the second processing unit, the top surface cleaning unit cleans the top surface of the substrate. In this case, in the second processing unit, the second transport unit carries the substrate into the reversing unit provided in at least one of the first and second placement units. The reversing unit reverses the substrate whose top surface is directed upward such that the back surface thereof is directed upward. Thus, the back surface cleaning unit can clean the back surface of the reversed substrate. In such a way, the top surface and the back surface of the substrate are cleaned in the second processing unit.

In the third processing unit, the development unit subjects the substrate after the exposure processing by the exposure device to the development processing. As described in the foregoing, the substrate before or after the exposure processing by the exposure device is cleaned by the top surface cleaning unit and the back surface cleaning unit, which allows the top surface and the back surface of the substrate carried into the exposure device or the top surface and the back surface of the substrate carried out of the exposure device to be kept clean. Thus, contamination in the exposure device due to contamination on the top surface and the back surface of the substrate before the exposure processing can be prevented, which can prevent a defective dimension and a defective shape of an exposure pattern. Alternatively, development problems due to contamination on the top surface and the back surface of the substrate after the exposure processing can be prevented.

Furthermore, in the second processing unit, the second transport unit transports the substrate among the top surface cleaning unit, the back surface cleaning unit, and the reversing unit, as described above. This causes a transport distance and a transport time period to be shorter, as compared with those in a case where the top surface cleaning unit, the back surface cleaning unit, and the reversing unit are respectively provided over separate processing units. As a result, throughput is improved.

Furthermore, the reversing unit is stacked on the first or second placement unit, which eliminates the necessity of providing a new processing unit for providing the reversing unit. This makes it feasible to miniaturize the substrate processing apparatus. Moreover, the reversing unit need not be provided within the processing unit, so that the number of units within each of the first to third processing units need not be reduced. This inhibits throughput to be reduced.

According to embodiments of the present invention, the cleaning region may include a first cleaning region and a second cleaning region, the first and second cleaning regions may be arranged opposite to each other with the second transport region interposed therebetween, the first cleaning region may be provided with the top surface cleaning unit, the second cleaning region may be provided with the back surface cleaning unit, the second transport unit may be provided such that the substrate can be transported among the top surface cleaning unit, the back surface cleaning unit, and the first placement unit, a second placement unit, and the reversing unit. In this case, the second transport unit is provided in the second transport region so as to be surrounded by the top surface cleaning unit, the back surface cleaning unit, the first placement unit, the second placement unit, and the reversing unit. This allows the second transport unit to quickly transport the substrate among the units by performing a rotating operation and a raising and lowering operation. This causes throughput in substrate processing to be improved.

The top surface cleaning unit and the back surface cleaning unit may clean the substrate before the exposure processing by the exposure device. In this case, the top surface and the back surface of the substrate carried into the exposure device are previously cleaned, which can reliably prevent contamination in the exposure device and can prevent a defective dimension and a defective shape of an exposure patter.

Furthermore, a component of a photosensitive material can be previously eluted by cleaning the substrate on which the photosensitive film has been formed. Thus, the exposure device can accurately perform the exposure processing by means of a liquid immersion method.

The top surface cleaning unit may simultaneously clean the top surface and an edge of the substrate. In this case, the top surface cleaning unit cleans the top surface and the edge of the substrate, so that the top surface and the edge, in addition to the back surface, of the substrate are kept clean. This can prevent contamination in the exposure device due to contamination on the top surface, the back surface, and the edge of the substrate before the exposure processing and can sufficiently prevent a defective dimension and a defective shape of an exposure pattern. Alternatively, this can prevent development problems due to contamination on the top surface and the back surface of the substrate after the exposure processing. Furthermore, the necessity of individually cleaning the top surface and the edge of the substrate is eliminated, which inhibits throughput in substrate processing from being reduced.

Other features, elements, characteristics, and advantages of the present invention will become more apparent from the following description of preferred embodiments of the present invention with reference to the attached drawings.

DETAILED DESCRIPTION OF SPECIFIC EMBODIMENTS

A substrate processing apparatus according to an embodiment of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask, or the like.

In the following description, a surface, on which various patterns such as a circuit pattern are formed, of the substrate is referred to as a top surface, and a surface on the opposite side thereto is referred to as a back surface. Furthermore, a surface, directed downward, of the substrate is referred to as a lower surface, and a surface, directed upward, of the substrate is referred to as an upper surface.

Furthermore, the following drawings are accompanied by arrows that respectively indicate X, Y, and Z directions perpendicular to one another for clarity of a positional relationship. The X and Y directions are perpendicular to each other within a horizontal plane, and the Z direction corresponds to a vertical direction. In each of the directions, the direction of the arrow is defined as a + (positive) direction, and the opposite direction is defined as a − (negative) direction. A rotation direction centered around the Z direction is defined as a θ direction.

(1) Configuration of Substrate Processing Apparatus

Figure 1:
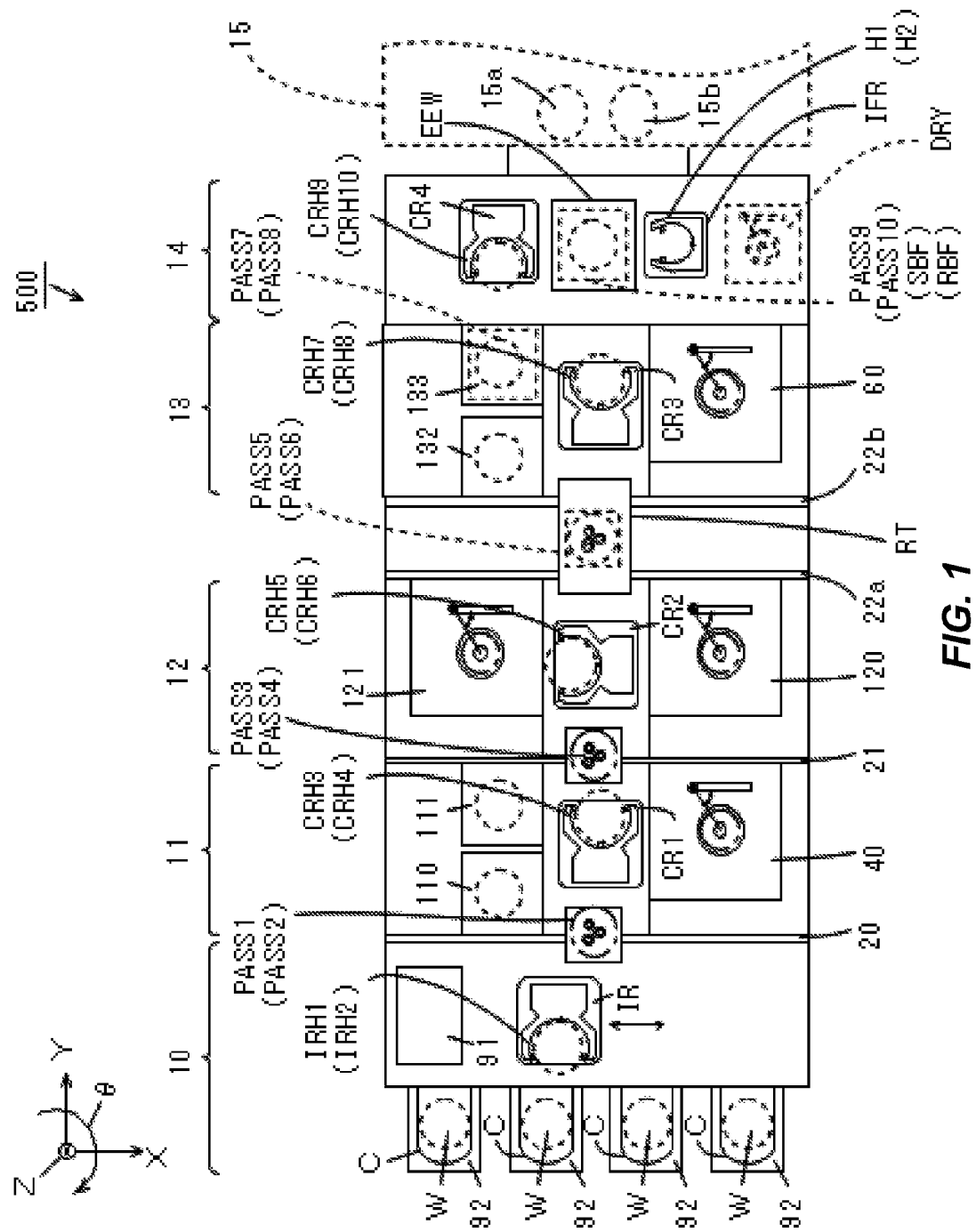
FIG. 1 is a plan view of a substrate processing apparatus according to an embodiment of the present invention.

FIG. 1 is a plan view of a substrate processing apparatus 500 according to an embodiment of the present invention. As shown in FIG. 1, the substrate processing apparatus 500 includes an indexer block 10, a resist film processing block 11, a cleaning/drying processing block 12, a development processing block 13, and an interface block 14. In the substrate processing apparatus 500, the blocks 10 to 14 are provided side by side in the foregoing order.

An exposure device 15 is arranged adjacent to the interface block 14 in the substrate processing apparatus 500. The exposure device 15 subjects a substrate W to exposure processing by means of a liquid immersion method.

The indexer block 10 includes a main controller (controller) 91 for controlling the operation of each of the blocks, a plurality of carrier platforms 92, and an indexer robot IR. The indexer robot IR has a vertical stack of hands IRH1 and IRH2 provided for receiving and transferring the substrates W.

The resist film processing block 11 includes thermal processing groups 110 and 111 for resist film, a coating processing group 40 for resist film, and a first central robot CR1. The coating processing group 40 is provided opposite to the thermal processing groups 110 and 111 with the first central robot CR1 interposed therebetween. The first central robot CR1 has hands CRH3 and CRH4 provided one above the other for receiving and transferring the substrates W.

A partition wall 20 is arranged between the indexer block 10 and the resist film processing block 11 for shielding an atmosphere. The partition wall 20 has substrate platforms PASS1 and PASS2 provided in close proximity one above the other for receiving and transferring the substrates W between the indexer block 10 and the resist film processing block 11. The upper substrate platform PASS 1 is used in transporting the substrates W from the indexer block 10 to the resist film processing block 11, and the lower substrate platform PASS2 is used in transporting the substrates W from the resist film processing block 11 to the indexer block 10.

Each of the substrate platforms PASS1 and PASS2 has an optical sensor (not shown) for detecting the presence or absence of the substrate W. This allows determination to be made whether or not the substrate W is placed on the substrate platform PASS 1 or PASS2. Furthermore, each of the substrate platforms PASS1 and PASS2 has a plurality of support pins secured thereto. Note that each of substrate platforms PASS3 to PASS10 described later is similarly provided with the optical sensor and the support pins, described above.

The cleaning/drying processing block 12 includes a first cleaning/drying processing group 120, a second cleaning/drying processing group 121, and a second central robot CR2. The first cleaning/drying processing group 120 is provided opposite to the second cleaning/drying processing group 121 with the second central robot CR2 interposed therebetween. The second central robot CR2 has hands CRH5 and CRH6 provided one above the other for receiving and transferring the substrates W.

A partition wall 21 is provided between the resist film processing block 11 and the cleaning/drying processing block 12 for shielding an atmosphere. The partition wall 21 has substrate platforms PASS3 and PASS4 provided in close proximity one above the other for receiving and transferring the substrates W between the resist film processing block 11 and the cleaning/drying processing block 12. The upper substrate platform PASS3 is used in transferring the substrates W from the resist film processing block 11 to the cleaning/drying processing block 12, and the lower substrate platform PASS4 is used in transferring the substrates W from the cleaning/drying processing block 12 to the resist film processing block 11.

The development processing block 13 includes a development processing group 60, thermal processing groups 132 and 133, and a third central robot CR3. The thermal processing group 133 is adjacent to the interface block 14, and includes substrate platforms PASS7 and PASS8, described later. The development processing group 60 is provided opposite to the thermal processing groups 132 and 133 with the third central robot CR3 interposed therebetween. The third central robot CR3 has hands CRH7 and CRH8 provided one above the other for receiving and transferring the substrates W.

Two partition walls 22a and 22b are provided between the cleaning/drying processing block 12 and the development processing block 13 for shielding an atmosphere. Each of the partition walls 22a and 22b has substrate platforms PASS5 and PASS6 provided in close proximity one above the other for receiving and transferring the substrates W between the development processing block 13 and the cleaning/drying processing block 12. Furthermore, reversing units RT, described more fully below, are stacked above the substrate platform PASS5 and below the substrate platform PASS6. Note that the substrate W is carried into and out of the two reversing units RT by the second central robot CR2 in the cleaning/drying processing block 12.

The reversing units RT are thus respectively provided above and below the substrate platforms PASS5 and PASS6, so that a gap occurs between the cleaning/drying processing block 12 and the development processing block 13. The size of the gap is sufficiently smaller than the width (the length thereof in the Y direction) of each of the blocks.

The upper substrate platform PASS5 is used in transporting the substrates W from the cleaning/drying processing block 12 to the development processing block 13, and the lower substrate platform PASS6 is used in transporting the substrates W from the development processing block 13 to the cleaning/drying processing block 12.

The reversing unit RT is used for reversing one surface (top surface) and the other surface (back surface) of the substrate W. When the top surface of the substrate W is directed upward, for example, the reversing unit RT reverses the substrate W such that the back surface of the substrate W is directed upward. The details of the reversing unit RT will be described more fully throughout the present specification and more particularly below.

The interface block 14 has a fourth central robot CR4, an edge exposure unit EEW, and an interface transporting mechanism IFR arranged in this order along the +X direction.

Substrate platforms PASS9 and PASS10, a sending buffer unit SBF, and a return buffer unit RBF, described later, are provided below the edge exposure unit EEW. The fourth central robot CR4 has hands CRH9 and CRH10 provided one above the other for receiving and transferring the substrates W, and the interface transporting mechanism IFR has hands H1 and H2 provided one above the other for receiving and transferring the substrates W.

Figure 2:
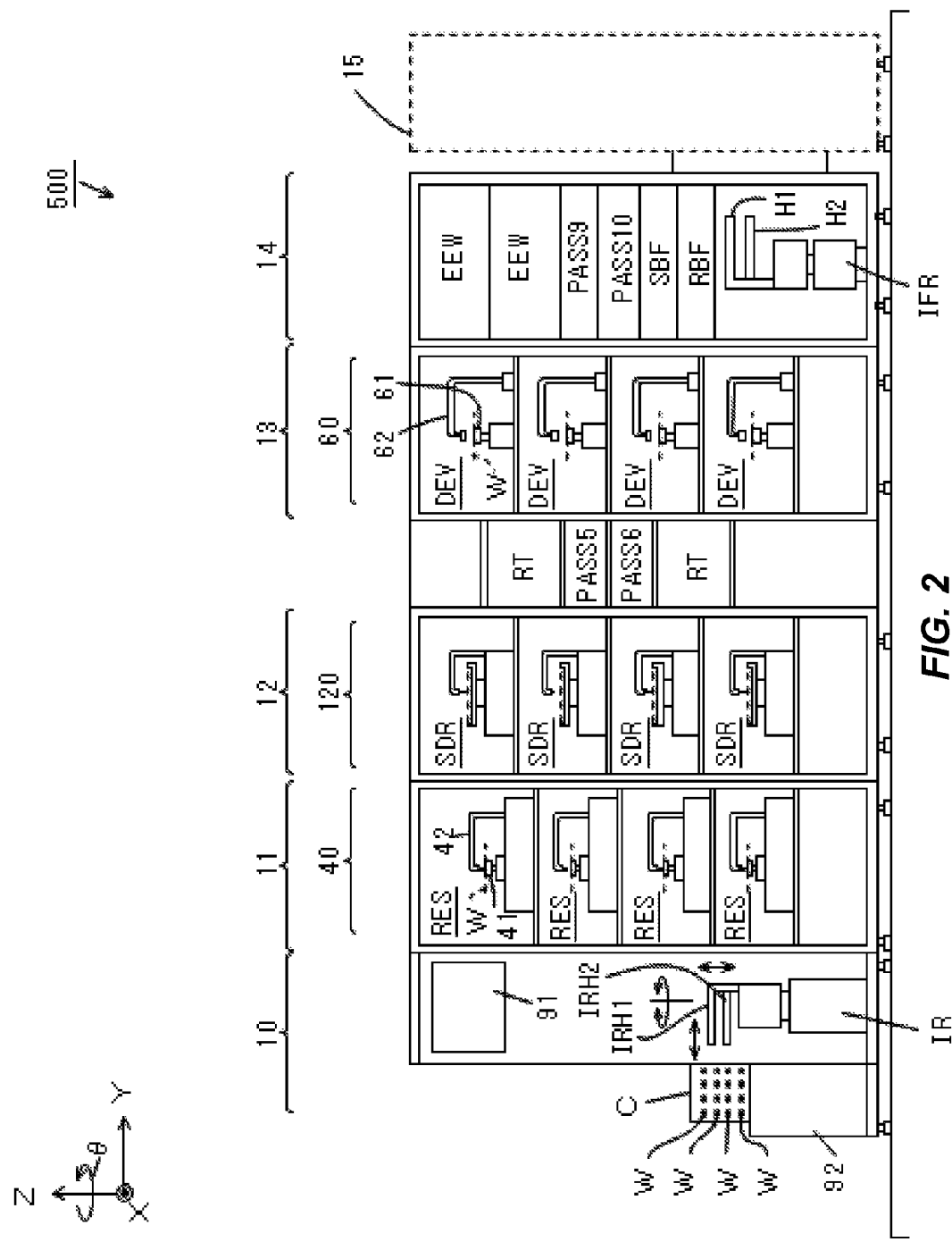
FIG. 2 is a side view on one side of the substrate processing apparatus shown in FIG. 1.

FIG. 2 is a side view on one side of the substrate processing apparatus 500 shown in FIG. 1. The coating processing group 40 (see FIG. 1) in the resist film processing block 11 has a vertical stack of four coating units RES. Each of the coating units RES includes a spin chuck 41 for rotating the substrate W with the substrate W held in a horizontal attitude by suction, and a supply nozzle 42 for supplying a coating liquid for a resist film to the substrate W held on the spin chuck 41. The first cleaning/drying processing group 120 in the cleaning/drying processing block 12 has a vertical stack of four back surface cleaning units SDR. The details of the back surface cleaning unit SDR will be described later.

The development processing group 60 (see FIG. 1) in the development processing block 13 has a vertical stack of four development processing units DEV. Each of the development processing units DEV includes a spin chuck 61 for rotating the substrate W with the substrate W held in a horizontal attitude by suction, and a supply nozzle 62 for supplying a development liquid to the substrate W held on the spin chuck 61.

As described in the foregoing, the substrate platforms PASS5 and PASS6 are provided between the cleaning/drying processing block 12 and the development processing block 13, and the reversing units RT are respectively provided above and below the substrate platforms PASS5 and PASS6.

The interface block 14 has a vertical stack of two edge exposure units EEW, substrate platforms PASS9 and PASS10, a sending buffer unit SBF, and a return buffer unit RBF arranged in this order in its substantially central part (see FIG. 1). Each of the edge exposure units EEW includes a spin chuck (not shown) for rotating the substrate W with the substrate W held in a horizontal attitude by suction, and a light irradiator (not shown) for exposing a peripheral portion of the substrate W held on the spin chuck.

Figure 3:
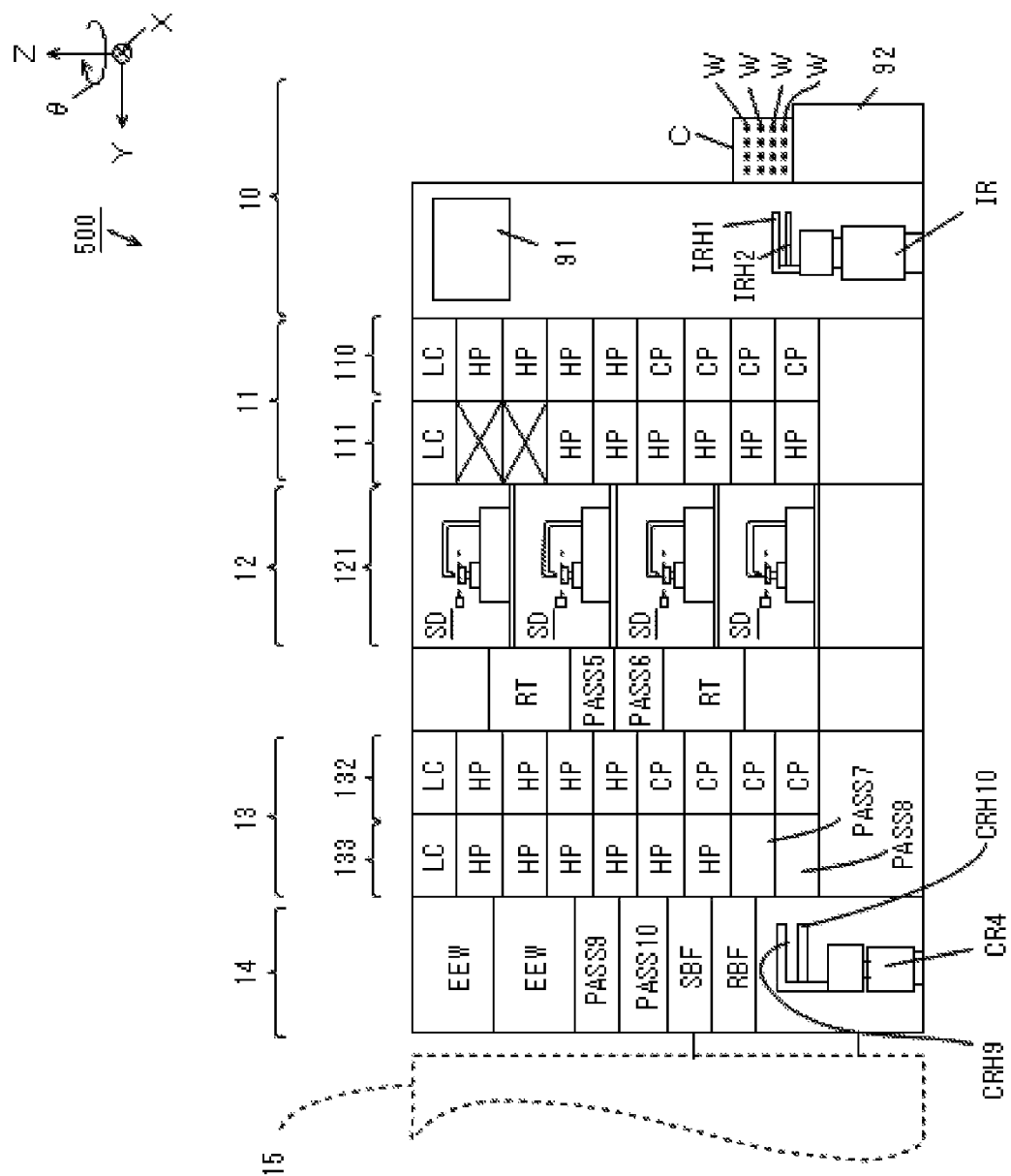
FIG. 3 is a side view on the other side of the substrate processing apparatus shown in FIG. 1.

FIG. 3 is a side view on the other side of the substrate processing apparatus 500 shown in FIG. 1. In the resist film processing block 11, the thermal processing group 110 has a vertical stack of four heating units HP and four cooling units CP, and the thermal processing group 111 has a vertical stack of six heating units HP. Furthermore, each of the thermal processing groups 110 and 111 has a local controller LC for controlling the respective temperatures of the heating unit HP and the cooling unit CP arranged in its uppermost part.

The second cleaning/drying processing group 121 in the cleaning/drying processing block 12 has a vertical stack of four top surface and edge cleaning/drying units SDR. The details of the top surface and edge cleaning/drying unit SD will be described later.

In the development processing block 13, the thermal processing group 132 has a vertical stack of four heating units HP and four cooling units CP, and the thermal processing group 133 has a vertical stack of six heating units HP and the substrate platforms PASS7 and PASS8. Furthermore, each of the thermal processing groups 132 and 133 has a local controller LC for controlling the respective temperatures of the heating unit HP and the cooling unit CP arranged in its uppermost part.

Note that the respective numbers of coating units RES, development processing units DEV, back surface cleaning units SD, top surface and edge cleaning/drying units SD, edge exposure units EEW, heating units HP, and cooling units CP may be changed, as needed, depending on the processing speed of each of the blocks 10 to 14.

(2) Operations of Substrate Processing Apparatus

The operations of the substrate processing apparatus 500 according to the present embodiment will be then described with reference to FIGS. 1 to 3. Carriers C that each store a plurality of substrates W in multiple stages are respectively placed on the carrier platforms 92 in the indexer block 10. Here, the plurality of substrates W that are stored in each of the carriers C are held with their top surfaces directed upward.

The indexer robot IR takes out the unprocessed substrate W that is stored in the carrier C using the upper hand IRH1. Thereafter, the indexer robot IR rotates in the ±θ direction while moving in the ±X direction, to place the unprocessed substrate W on the substrate platform PASS 1. Although FOUPs (Front Opening Unified Pods) are adopted as the carriers C in the present embodiment, the present invention is not limited to the same. For example, SMIF (Standard Mechanical Inter Face) pods or OCs (Open Cassettes) that expose the stored substrates W to outside air may be also used.

Furthermore, although linear-type transport robots which move their hands forward and backward by linearly sliding them to the substrates W are respectively used as the indexer robot IR, the first to fourth center robots CR1 to CR4, and the interface transporting mechanism IFR, the present invention is not limited to the same. For example, multi-joint type transport robots that linearly move their hands forward and backward by moving their joints may be used.

The substrate W placed on the substrate platform PASS 1 is received by the first central robot CR1 in the resist film processing block 11. The first central robot CR1 carries the substrate W into the coating processing group 40. In the coating processing group 40, the coating unit RES forms a coating of a resist film on the top surface of the substrate W. Thereafter, the first central robot CR1 takes out the substrate W that has been subjected to the coating processing from the coating processing group 40, and carries the substrate W into the thermal processing group 110 or 111. Then, the first central robot CR1 takes out the thermally processed substrate W from the thermal processing group 110 or 111, and places the substrate W on the substrate platform PASS3.

The substrate W placed on the substrate platform PASS3 is received by the second central robot CR2 in the cleaning/drying processing block 12. The second central robot CR2 carries the substrate W into the top surface and edge cleaning/drying unit SD in the second cleaning/drying processing group 121. The top surface and edge cleaning/drying processing unit SD subjects the substrate W that has been carried thereinto to top surface and edge cleaning processing, described later. This causes the top surface and an edge of the substrate W before exposure processing by the exposure device 15 to be kept clean.

Thereafter, the second central robot CR2 takes out the substrate W that has been subjected to the top surface and edge cleaning processing from the top surface and edge cleaning/drying unit SD, and carries the substrate W into the reversing units RT stacked above and below the substrate platforms PASS5 and PASS6. Thus, the reversing unit RT reverses the substrate W whose top surface is directed upward such that the back surface thereof is directed upward.

Subsequently, the second central robot CR2 takes out the substrate W whose back surface is directed upward from the reversing unit RT, and carries the substrate W into the back surface cleaning unit SDR in the first cleaning/drying processing group 120. Thus, the back surface cleaning unit SDR subjects the substrate W to back surface cleaning processing, described later, which causes the back surface of the substrate W before the exposure processing by the exposure device 15 to be kept clean.

Then, the second central robot CR2 takes out the substrate W whose back surface has been cleaned from the back surface cleaning unit SDR, and carries the substrate W into the reversing unit RT again. Thus, the reversing unit RT reverses the substrate W whose back surface is directed upward such that the top surface thereof is directed upward. The second central robot CR2 takes out the substrate W whose top surface is directed upward from the reversing unit RT, and places the substrate W on the substrate platform PASS5.

The substrate W placed on the substrate platform PASS5 is received by the third central robot CR3 in the development processing block 13. The third central robot CR3 places the substrate W on the substrate platform PASS7 in the thermal processing group 133.

The substrate W placed on the substrate platform PASS7 is received by the fourth central robot CR4 in the interface block 14. The fourth central robot CR4 carries the substrate W into the edge exposure unit EEW. The edge exposure unit EEW subjects the peripheral portion of the substrate W to edge exposure processing. The fourth central robot CR4 then takes out the substrate W that has been subjected to the edge exposure processing from the edge exposure unit EEW, and places the substrate W on the substrate platform PASS9.

The interface transporting mechanism IFR carries the substrate W placed on the substrate platform PASS9 into a substrate carry-in section 15a (see FIG. 1) in the exposure device 15. Note that when the exposure device 15 cannot receive the substrate W, the substrate W is temporarily stored in the sending buffer unit SBF.

After the exposure device 15 subjects the substrate W to exposure processing, the interface transporting mechanism IFR takes out the substrate W from a substrate carry-out section 15b (see FIG. 1) in the exposure device 15, and places the substrate W on the substrate platform PASS10. When the interface block 14 cannot temporarily place the substrate W on the substrate platform PASS10 due to a failure or the like, the substrate W after the exposure processing can be temporarily stored in the return buffer unit RBF in the interface block 14.

The substrate W placed on the substrate platform PASS 10 is received by the fourth central robot CR4 in the interface block 14. The fourth central robot CR4 carries the received substrate W into the thermal processing group 133 in the development processing block 13. In the thermal processing group 133, the substrate W is subjected to post-exposure bake (PEB). Thereafter, the fourth central robot CR4 takes out the substrate W from the thermal processing group 133, and places the substrate W on the substrate platform PASS8. Although the thermal processing group 133 subjects the substrate W to the post-exposure bake in the present embodiment, the thermal processing group 132 may subject the substrate W to post-exposure bake.

The substrate W placed on the substrate platform PASS8 is received by the third central robot CR3 in the development processing block 13. The third central robot CR3 carries the substrate W into the development processing group 60. This causes the substrate W to be subjected to development processing. Thereafter, the third central robot CR3 takes out the substrate W after the development processing from the development processing group 60, and carries the substrate W into the thermal processing group 132. In the thermal processing group 132, the substrate W after the development processing is subjected to thermal processing. The third central robot CR3 takes out the thermally processed substrate W from the thermal processing group 132, and places the substrate W on the substrate platform PASS6.

The substrate W placed on the substrate platform PASS6 is received by the second central robot CR2 in the cleaning/drying processing block 12. The second central robot CR2 places the substrate W on the substrate platform PASS4. The substrate W placed on the substrate platform PASS6 is received by the first central robot CR1 in the resist film processing block 11. The first central robot CR1 places the substrate W on the substrate platform PASS2. The indexer robot IR in the indexer block 9 stores the substrate W placed on the substrate platform PASS2 in the carrier C.

(3) As to the Top Surface and Edge Cleaning/Drying Unit

The top surface and edge cleaning/drying unit SD will be herein described in detail with reference to the drawings. Note that the operation of each of constituent elements in the top surface and edge cleaning/drying unit SD, described below, is controlled by the main controller (controller) 91 shown in FIG. 1.

(3-a) Configuration of the Top Surface and Edge Cleaning/Drying Unit

Figure 4:
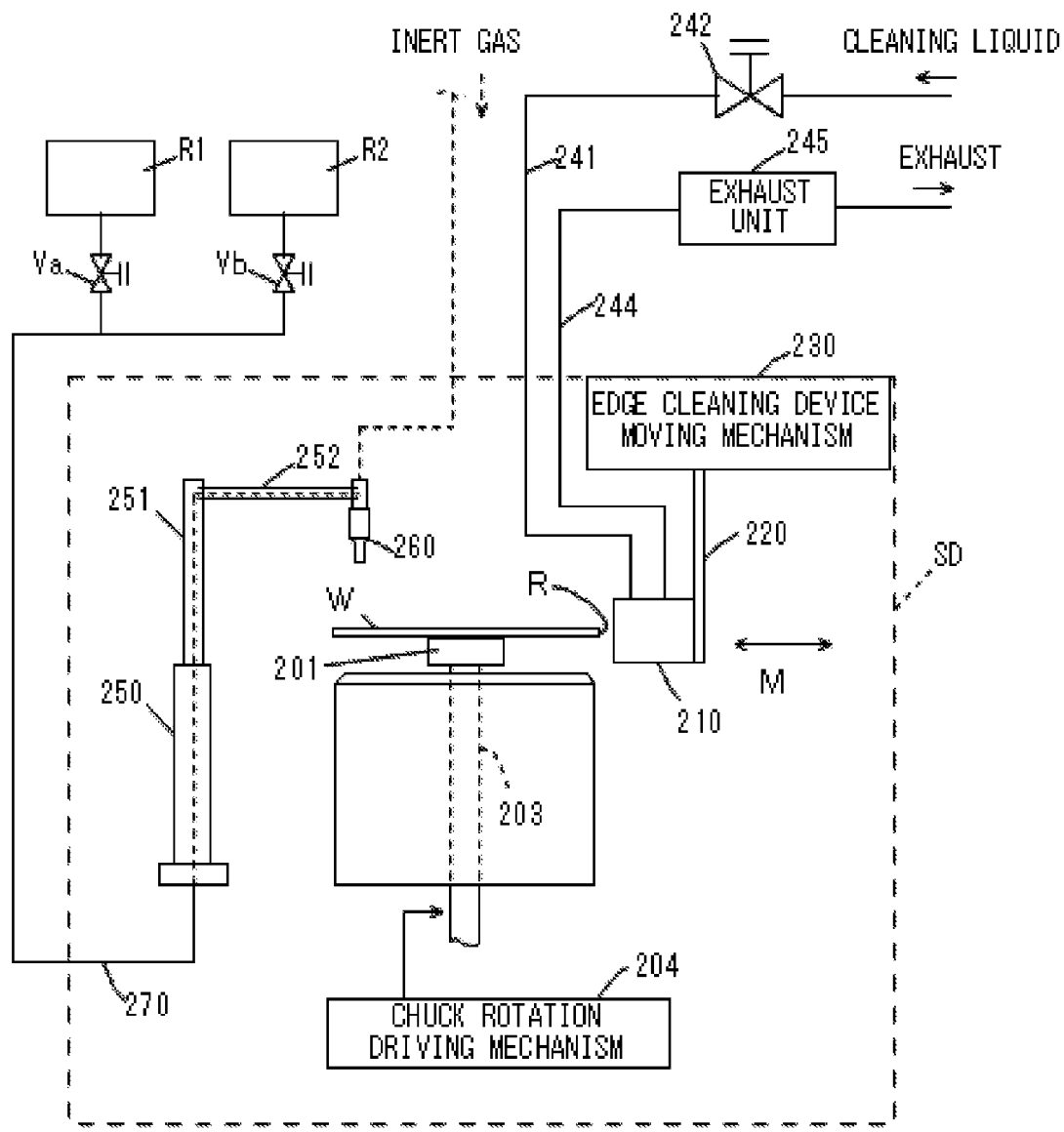
FIG. 4 is a diagram for explaining the configuration of a top surface and edge cleaning/drying unit.

FIG. 4 is a diagram for explaining the configuration of the top surface and edge cleaning/drying unit SD. In the top surface and edge cleaning/drying unit SD, the top surface and the edge of the substrate W are cleaned (top surface and edge cleaning processing). As shown in FIG. 4, the top surface and edge cleaning/drying unit SD includes a spin chuck 201 for rotating the substrate W about a vertical rotation axis passing through the center of the substrate W while horizontally holding the substrate W.

The spin chuck 201 is secured to an upper end of a rotation shaft 203 that is rotated by a chuck rotation driving mechanism 204. A suction path (not shown) is formed in the spin chuck 201. Air inside the suction path is exhausted with the substrate W placed on the spin chuck 201, to adsorb a lower surface of the substrate W on the spin chuck 201 under vacuum, so that the substrate W can be held in a horizontal attitude.

A motor 250 is provided beside the spin chuck 201. A rotation shaft 251 is connected to the motor 250. An arm 252 is connected to the rotation shaft 251 so as to extend in the horizontal direction, and its tip is provided with a top surface cleaning nozzle 260. The motor 250 causes the rotation shaft 251 to rotate while causing the arm 252 to swing. This allows the top surface cleaning nozzle 260 to move between an upper position and an outer position of the substrate W held by the spin chuck 201.

A supply pipe 270 for cleaning processing is provided so as to pass through the motor 250, the rotation shaft 251, and the arm 252. The supply pipe 270 is connected to a cleaning liquid supply source RI and a rinse liquid supply source R2 through a valve Va and a valve Vb, respectively. By controlling the opening and closing of the valves Va and Vb, it is possible to select a processing liquid supplied to the supply pipe 270 and adjust the supply amount thereof. In the configuration shown in FIG. 4, a cleaning liquid can be supplied to the supply pipe 270 by opening the valve Va, and a rinse liquid can be supplied to the supply pipe 270 by opening the valve Vb. By thus controlling the opening and closing of the valves Va and Vb, it is possible to supply the cleaning liquid or the rinse liquid to the top surface of the substrate W through the supply pipe 270 and the top surface cleaning nozzle 260. This allows the top surface of the substrate W to be cleaned.

An example of the cleaning liquid is any one of a predetermined resist solvent, a fluorine-based medical liquid, an ammonia/hydrogen peroxide mixture, and a liquid used for the liquid immersion method in the exposure device 17. Another example of the cleaning liquid can be also any one of pure water, a pure water solution containing a complex (ionized), carbonic water, hydrogen water, electrolytic ionic water, HFE (hydrofluoroether), hydrofluoric acid, sulfuric acid, and a sulfuric acid/hydrogen peroxide mixture. An example of the rinse liquid is any one of pure water, carbonated water, hydrogen water, electrolytic ionic water, and HFE.

Furthermore, an edge cleaning device moving mechanism 230 is provided beside the spin chuck 201 and in an upper part of the top surface and edge cleaning/drying unit SD. A stick-shaped supporting member 220 extending downward is attached to the edge cleaning device moving mechanism 230. The supporting member 220 moves in the vertical direction and the horizontal direction by the edge cleaning device moving mechanism 230.

An edge cleaning device 210 having a substantially cylindrical shape is attached to a lower end of the supporting member 220 so as to extend in the horizontal direction. This causes the edge cleaning device 210, together with the supporting member 220, to move by the edge cleaning device moving mechanism 230. This allows one end of the edge cleaning device 210 to be opposite to the edge R of the substrate W held in the spin chuck 201. In the following description, the one end, which is opposite to the edge R of the substrate W, of the edge cleaning device 210 is taken as a front surface.

Figure 5:
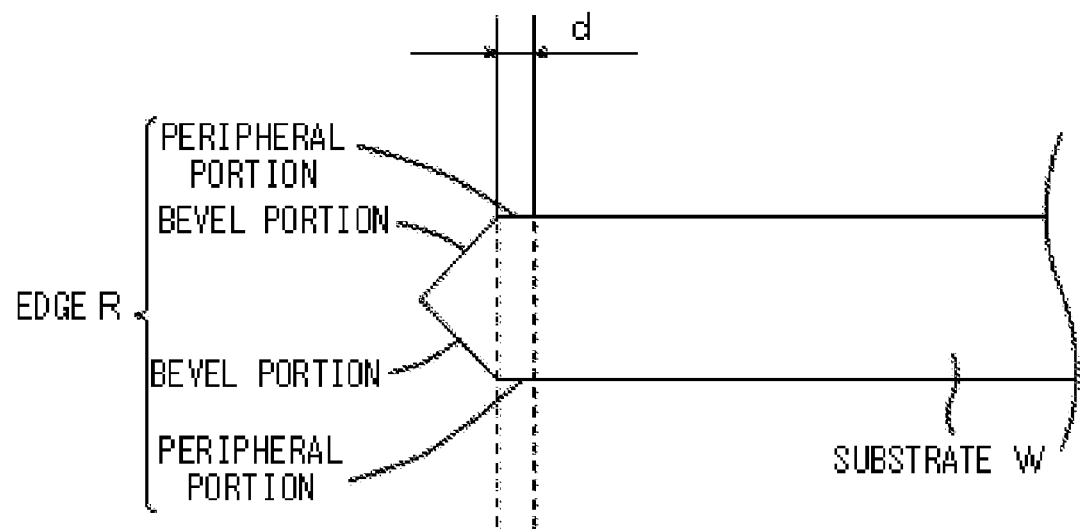
FIG. 5 is a schematic view for explaining an edge of a substrate.

The definition of the edge R of the substrate W will be herein described while referring to the following drawings. FIG. 5 is a schematic view for explaining the edge R of the substrate W. The above-mentioned resist film (not shown) is formed on the substrate W. The substrate W has an end surface. The end surface is schematically illustrated in FIG. 5. The end surface is generally referred to as a bevel portion. A region inwardly spaced a distance d apart from an end of a surface of the substrate W is generally referred to as a peripheral portion. In the present embodiment, the bevel portion and the peripheral portion are generically referred to as an edge R. Note that the distance d is 2 to 3 mm, for example. Furthermore, the edge R need not include the peripheral portion. In this case, the top surface and edge cleaning/drying unit SD cleans only the bevel portion at the edge R of the substrate W. Generally, the resist cover film may not be formed so as to cover the peripheral portion on the substrate W in many cases. That is, the resist film formed in the peripheral portion on the substrate W is exposed.

Returning to FIG. 4, the edge cleaning device 210 moves to a position in the vicinity of the edge R of the substrate W on the spin chuck 201 by the edge cleaning device moving mechanism 230 during the top surface and edge cleaning processing, while waiting outside the spin chuck 201 in a time period during which the top surface and edge cleaning processing is not performed.

The edge cleaning device 210 has a space in its inner part (a cleaning chamber 211, described later). A cleaning liquid supply pipe 241 and an exhaust pipe 244 are connected to the edge cleaning device 210. The cleaning liquid supply pipe 241 is connected to a cleaning liquid supply system (not shown) through a valve 242. By opening the valve 242, the cleaning liquid is supplied to the inner space of the edge cleaning device 210 through the cleaning liquid supply pipe 241. Furthermore, the exhaust pipe 244 is connected to an exhaust unit 245. The exhaust unit 245 sucks in an atmosphere in the inner space of the edge cleaning device 210, and exhausts the air through the exhaust pipe 244.

Figure 6:
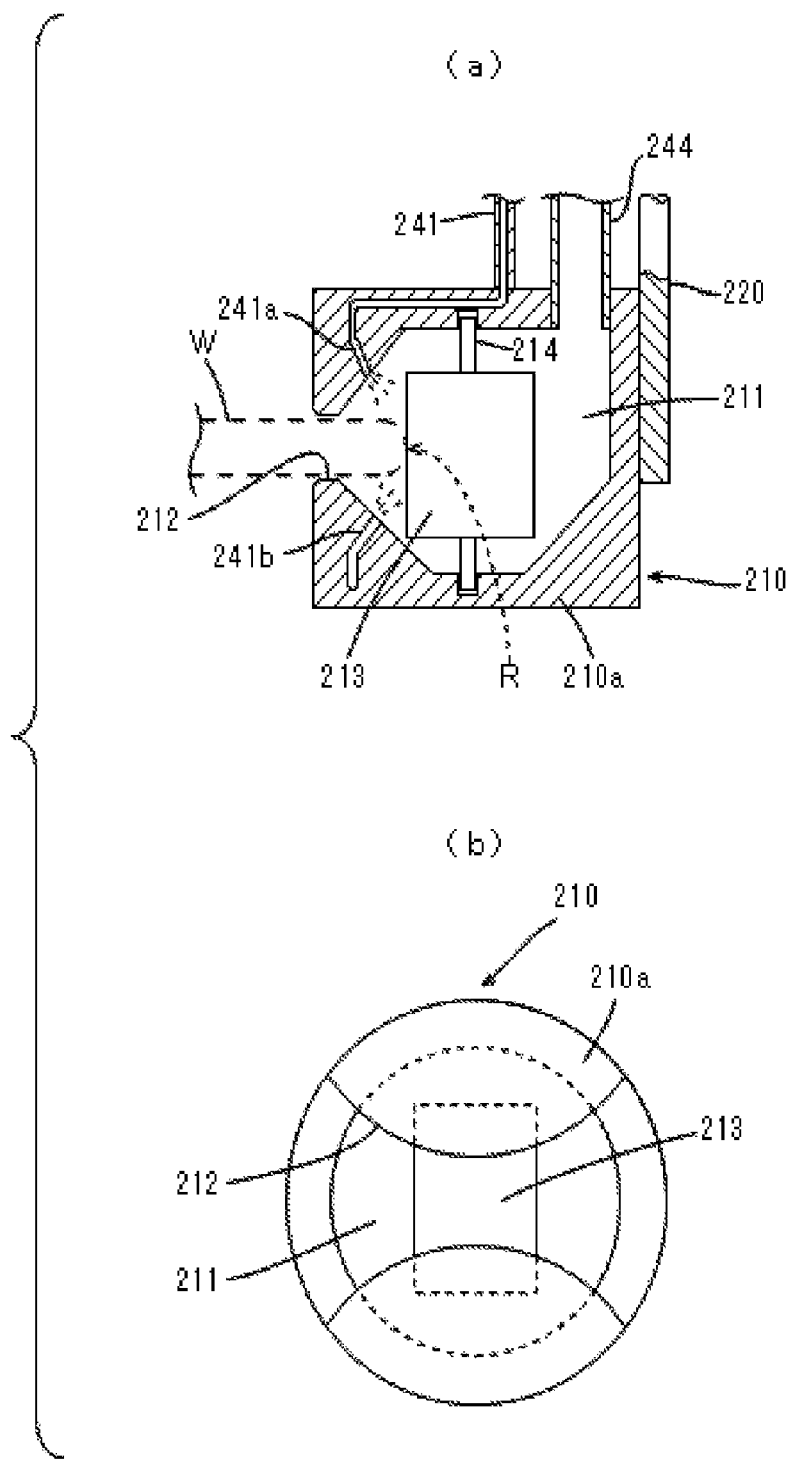
FIG. 6 is a diagram for explaining the configuration of an edge cleaning device in the top surface and edge cleaning/drying unit shown in FIG. 4.

The details of the edge cleaning device 210 will be herein described. FIG. 6 is a diagram for explaining the configuration of the edge cleaning device 210 in the top surface and edge cleaning/drying unit SD shown in FIG. 4. FIG. 6(a) is a vertical sectional view of the edge cleaning device 210, and FIG. 6(b) is a front view of the edge cleaning device 210.

As shown in FIG. 6(a), a cleaning chamber 211 is formed inside a substantially cylindrical housing 210a in the edge cleaning device 210. Furthermore, as shown in FIGS. 6(a) and 6(b), an opening 212 for causing the cleaning chamber 211 and the outside of the housing 210a to communicate with each other is formed on the side of a top surface of the housing 210a. The opening 212 has a front surface and a lower surface in a circular arc shape such that the vertical width thereof is gradually enlarged sideward on both sides from the center thereof. During the top surface and edge cleaning processing of the substrate W, the edge R of the substrate W held by suction on the spin chuck 201 is inserted into the opening 212.

A brush 213 having a substantially cylindrical shape is arranged so as to extend in the vertical direction within the cleaning chamber 211. The brush 213 is attached to a rotation shaft 214 extending in the vertical direction. An upper end and a lower end of the rotation shaft 214 are respectively attached to rotation bearings formed at the top and the bottom of the cleaning chamber 211. This causes the brush 213 to be rotatably supported by the cleaning chamber 211 and the rotation shaft 214. During the top surface and edge cleaning processing of the substrate W, the edge R of the rotating substrate W and the brush 213 come into contact with each other. This causes the edge R of the substrate W to be cleaned with the brush 213.

Here, in the top surface and edge cleaning/drying unit SD shown in FIG. 4, the rotation shaft 214 having the brush 213 attached thereto is arranged so as to be substantially parallel to the rotation shaft 203 having the spin chuck 201 secured thereto. This causes the brush 213 to rotate with the brush 213 brought into reliable contact with the edge R of the rotating substrate W. The cleaning liquid supply pipe 241 and the exhaust pipe 244, described above, are connected to the top of the edge cleaning device 210.

The cleaning liquid supply pipe 241 is connected to cleaning liquid supply paths 241a and 241b formed within the housing 210a. As shown in FIG. 6(a), the cleaning liquid supply path 241a extends to an inner surface in an upper part of the cleaning chamber 211 from the outside of the housing 210a. The cleaning liquid supply path 241b extends to an inner surface in a lower part of the cleaning chamber 211 from the outside of the housing 210a. FIG. 6(a) illustrates only a part of the cleaning liquid supply pipe 241b.

Such a configuration causes the cleaning liquid supplied to the edge cleaning device 210 to be sprayed in the vertical direction toward the edge R of the substrate W that comes into contact with the brush 213 within the cleaning chamber 211 during the top surface and edge cleaning processing of the substrate W. This causes the edge R of the substrate W to be efficiently cleaned.

The exhaust pipe 244 is inserted into the cleaning chamber 211 through a hole provided at the top of the housing 210a. This causes an atmosphere in the cleaning chamber 211 to be sucked in by the exhaust unit 245 shown in FIG. 4 and exhausted through the exhaust pipe 244, as described above. In the cleaning chamber 211, the exhaust unit 245 thus exhausts the atmosphere inside thereof, so that the volatilized cleaning liquid and a mist of the cleaning liquid are efficiently exhausted.

In the foregoing, an example of the cleaning liquid sprayed on the edge R of the substrate W is any one of a predetermined resist solvent, a fluorine-based medical liquid, an ammonia/hydrogen peroxide mixture, and a liquid used for the liquid immersion method in the exposure device 15. Another example of the cleaning liquid can be also any one of pure water, a pure water solution containing a complex (ionized), carbonic water, hydrogen water, electrolytic ionic water, HFE (hydrofluoroether), hydrofluoric acid, sulfuric acid, and a sulfuric acid/hydrogen peroxide mixture, similarly to the example of the cleaning liquid for cleaning the top surface of the substrate W.

When the edge R of the substrate W is cleaned with the brush 213, as described above, the brush 213 is brought into direct contact with the edge R of the substrate W, so that a contaminant at the edge R of the substrate W can be physically stripped. This allows the contaminant that has firmly adhered to the edge R to be more reliably removed.

(3-b) Operations of Top Surface and Edge Cleaning/Drying Unit

The processing operations of the top surface and edge cleaning/drying processing unit SD having the above-mentioned configuration will be described. When the substrate W is carried into the top surface and edge cleaning/drying unit SD, the second central robot CR2 shown in FIG. 1 places the substrate W on the spin chuck 201. The substrate W placed on the spin chuck 201 is held by suction on the spin chuck 201.

Then, the top surface cleaning nozzle 260 moves to above the center of the substrate W while the edge cleaning device 210 moves to a position in the vicinity of the edge R of the substrate W on the spin chuck 201. The rotation shaft 203 rotates so that the substrate W rotates. In this state, the cleaning liquid is discharged to the top surface of the substrate W from the top surface cleaning nozzle 260. This causes the top surface of the substrate W to be cleaned. At the same time, the cleaning liquid is supplied to the edge cleaning device 210. This causes the edge R of the substrate W to be cleaned.

After an elapse of a predetermined time period, the top surface cleaning nozzle 260 discharges the rinse liquid to the top surface of the substrate W in place of the cleaning liquid. This causes the cleaning liquid supplied onto the substrate W to be cleaned away. At this time, the supply of the cleaning liquid to the edge cleaning device 210 is stopped. Thus, the rinse liquid discharged to the top surface of the substrate W flows into the edge R of the substrate W, so that the cleaning liquid that adheres to the edge R of the substrate W is cleaned away.

Furthermore, after an elapse of a predetermined time period, the top surface cleaning nozzle 260 stops to discharge the rinse liquid to the substrate W, to move outward apart from the substrate W held by the spin chuck 201. The edge cleaning device 210 also moves outward apart from the substrate W. The number of revolutions of the rotation shaft 203 increases. This causes a great centrifugal force to act on the rinse liquid remaining on the substrate W. Thus, the liquid that adheres to the top surface and the edge R of the substrate W is scattered, so that the substrate W is dried. The cleaning liquid and the rinse liquid may be supplied onto the substrate W by means of a soft spray method using a two-fluid nozzle that discharges a fluid mixture of a gas and a liquid.

When the two-fluid nozzle is used as the top surface cleaning nozzle 260 shown in FIG. 4, the two-fluid nozzle that sprays the fluid mixture is moved so as to pass through the center of the rotating substrate W from the outside of the substrate W. This allows the fluid mixture including the cleaning liquid or the rinse liquid to be efficiently sprayed over the whole surface of the substrate W. When the two-fluid nozzle is thus used, inert gas such as nitrogen gas ($N_2$), argon gas, or helium gas must be supplied to the top surface cleaning nozzle 260, as indicated by a dotted line in FIG. 4.

Figure 7:
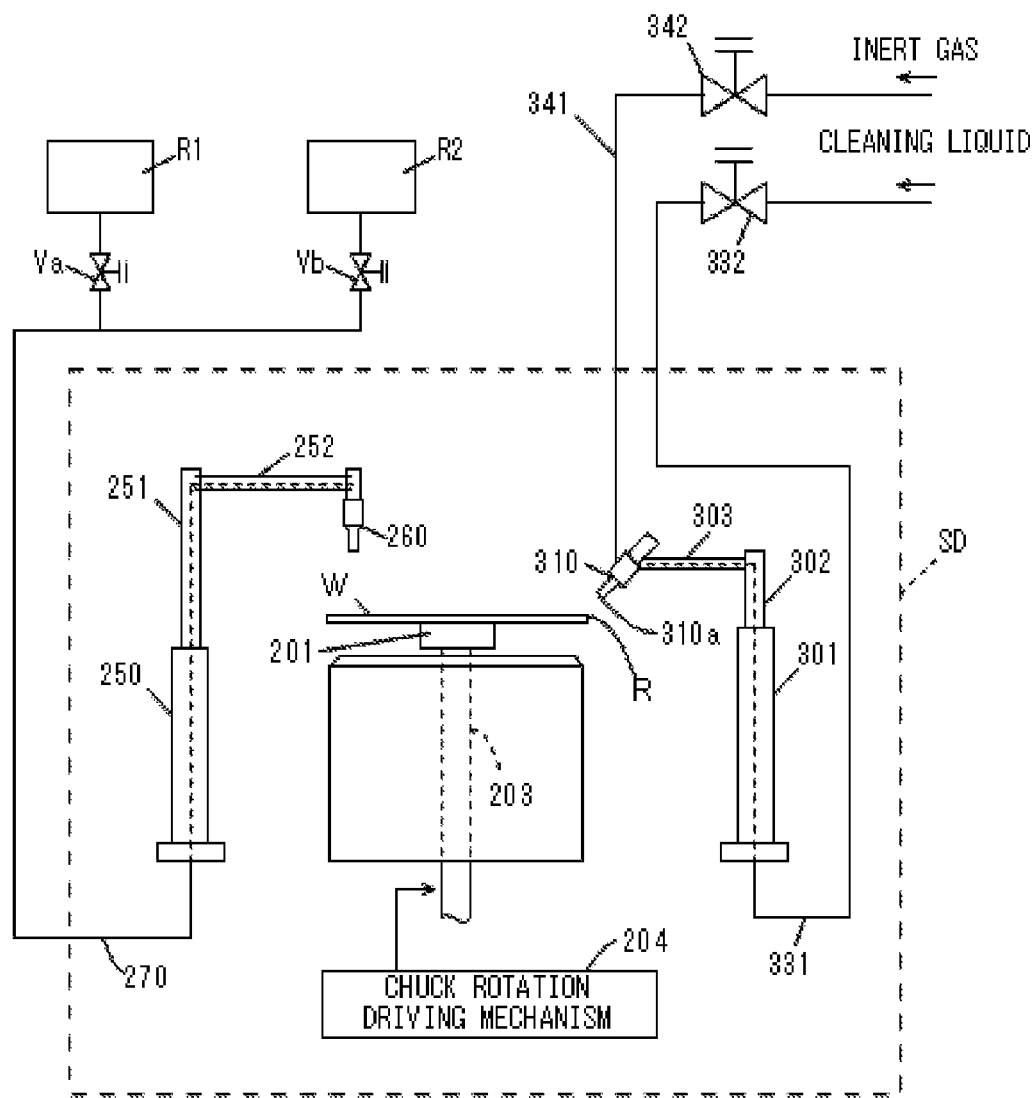
FIG. 7 is a diagram for explaining another example of the configuration of the top surface and edge cleaning/drying unit.

(3-c) Another Example of a Configuration of the Top Surface and Edge Cleaning/Drying Unit The top surface and edge cleaning/drying unit SD may have the following configuration. FIG. 7 is a diagram for explaining another example of the configuration of the top surface and edge cleaning/drying unit SD. The difference between the top surface and edge cleaning/drying unit SD shown in FIG. 7 and the top surface and edge cleaning/drying unit SD shown in FIG. 4 will be described. As shown in FIG. 7, in the top surface and edge cleaning/drying unit SD in this example, a two-fluid nozzle 310 is provided as a constituent element for cleaning an edge R of a substrate W in place of the edge cleaning device 210 shown in FIG. 4.

Specifically, a motor 301 is provided outside a spin chuck 201. A rotation shaft 302 is connected to the motor 301. An arm 303 is connected to the rotation shaft 302 so as to extend in the horizontal direction, and the two-fluid nozzle 310 is provided at the tip of the arm 303. The two-fluid nozzle 310 discharges a fluid mixture of a gas and a liquid. Note that at the tip of the arm 303, the two-fluid nozzle 310 is attached thereto so as to be inclined to the top surface of the substrate W held by the spin chuck 201.

When top surface and edge cleaning processing of the substrate W is started, the motor 301 causes the rotation shaft 302 to rotate while causing the arm 303 to swing. This causes the two-fluid nozzle 310 to move to above the edge R of the substrate W held by the spin chuck 201 As a result, a discharge section 310a of the fluid mixture in the two-fluid nozzle 310 is opposite to the edge R of the substrate W.

A cleaning liquid supply pipe 331 is provided so as to pass through the motor 301, the rotation shaft 302, and the arm 303. The cleaning liquid supply pipe 331 has its one end connected to the two-fluid nozzle 310 and the other end connected to a cleaning liquid supply system (not shown) through a valve 332. A cleaning liquid is supplied to the two-fluid nozzle 310 through the cleaning liquid supply pipe 331 by opening the valve 332.

One end of a gas supply pipe 341, together with the cleaning liquid supply pipe 331, is connected to the two-fluid nozzle 3 10. The other end of the gas supply pipe 341 is connected to a gas supply system (not shown) through a valve 342. A gas is supplied to the two-fluid nozzle 310 by opening the valve 342. An example of the gas supplied to the two-fluid nozzle 310 is inert gas such as nitrogen gas ($N_2$), argon gas, or helium gas.

When the substrate W is subjected to the top surface and edge cleaning processing, the cleaning liquid and the gas are supplied to the two-fluid nozzle 3 10. This causes the cleaning liquid and a rinse liquid to be discharged from the top surface cleaning nozzle 260 to the top surface of the substrate W while causing the fluid mixture to be discharged from the two-fluid nozzle 310 to the edge R of the rotating substrate W.

Thus, a high cleaning effect can be obtained by using the fluid mixture. This causes the edge R of the substrate W to be satisfactorily cleaned. The fluid mixture of the gas and the liquid is discharged to the edge R of the substrate W, so that the edge R of the substrate W is cleaned in non-contact, which prevents the edge R of the substrate W from being damaged during the cleaning. Furthermore, it is also possible to easily control the cleaning conditions of the edge R of the substrate W by controlling the discharge pressure of the fluid mixture and the ratio of the gas and the liquid in the fluid mixture. Furthermore, the two-fluid nozzle 310 allows the uniform fluid mixture to be discharged to the edge R of the substrate W, which prevents the edge R from being non-uniform in cleaning.

The present invention is not limited to the above-mentioned example. For example, in the top surface and edge cleaning/drying unit SD, a ultrasonic nozzle containing a high-frequency vibrator may be used as a constituent element for cleaning the edge R of the substrate W.

(4) As to the Back Surface Cleaning Unit

The back surface cleaning unit SDR will be herein described in detail with reference to the drawings. Note that the operation of each of constituent elements in the back surface cleaning unit SDR, described below, is controlled by the main controller (controller) 91 shown in FIG. 1.

(4-a) Configuration of the Back Surface Cleaning Unit

Figure 8:
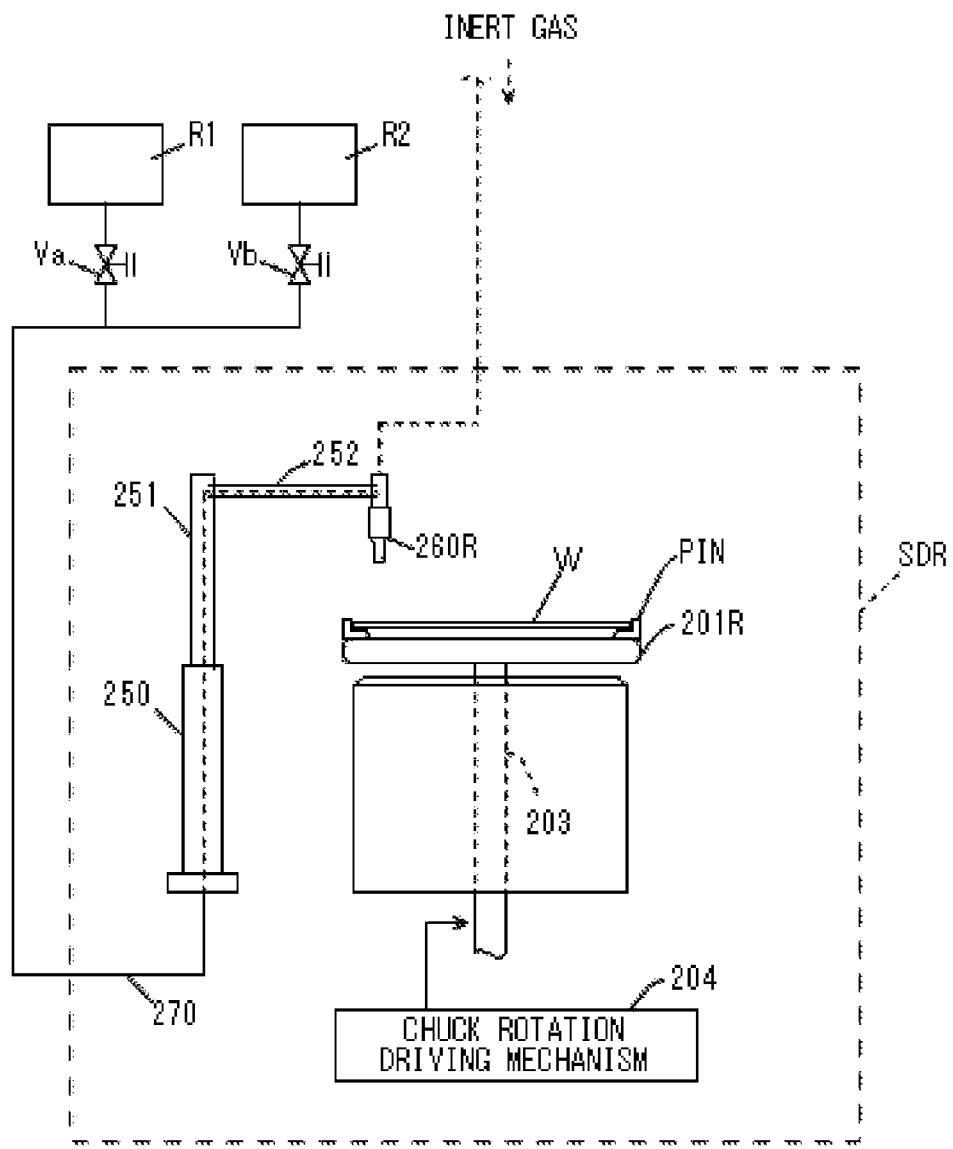
FIG. 8 is a diagram for explaining the configuration of a back surface cleaning unit.

FIG. 8 is a diagram for explaining the configuration of the back surface cleaning unit SDR. The back surface cleaning unit SDR cleans a back surface of a substrate W (back surface cleaning processing). As shown in FIG. 8, the back surface cleaning unit SDR includes a mechanical spin chuck 201R for rotating the substrate W about a vertical axis passing through the center of the substrate W while horizontally holding the substrate W. The spin chuck 201R holds an outer peripheral portion of the substrate W. The spin chuck 201R is secured to an upper end of a rotation shaft 203 that is rotated by a chuck rotation driving mechanism 204.

As described in the foregoing, the substrate W is carried into the back surface cleaning unit SDR with the back surface thereof directed upward. Therefore, the substrate W is held by the spin chuck 201R with the back surface thereof directed upward. At the time of the back surface cleaning processing, the substrate W is rotated while maintaining a horizontal attitude with a peripheral portion on its lower surface and the outer peripheral portion held by a spin holding pin PIN on the spin chuck 201R.

A motor 250 is provided outside the spin chuck 201R, as in the top surface and edge cleaning/drying unit SD. A rotation shaft 251 is connected to the motor 250. An arm 252 is connected to the rotation shaft 251 so as to extend in the horizontal direction, and its tip is provided with a back surface cleaning nozzle 260R. The motor 250 causes the rotation shaft 251 to rotate while causing the arm 252 to swing. This allows the back surface cleaning nozzle 260R to move between an upper position and an outer position of the substrate W held by the spin chuck 201R.

A supply pipe 270 for cleaning processing is provided so as to pass through the motor 250, the rotation shaft 251, and the arm 252. The supply pipe 270 is connected to a cleaning liquid supply source RI and a rinse liquid supply source R2 through a valve Va and a valve Vb, respectively, as in the top surface and edge cleaning/drying unit SD. By controlling the opening and closing of the valves Va and Vb, it is possible to supply a cleaning liquid or a rinse liquid to the back surface of the substrate W through the supply pipe 270 and the back surface cleaning nozzle 260R. This allows the back surface of the substrate W to be cleaned.

(4-b) Operations of the Back Surface Cleaning Unit

When the substrate W is carried into the back surface cleaning unit SD, the second central robot CR2 shown in FIG. 1 places the substrate W on the spin chuck 201R. The substrate W placed on the spin chuck 201 is held by the spin chuck 201R. The back surface cleaning nozzle 260R then moves to above the center of the substrate W. The rotation shaft 203 rotates so that the substrate W rotates. In this state, the cleaning liquid is discharged to the back surface of the substrate W from the back surface cleaning nozzle 260R. This causes the back surface of the substrate W to be cleaned.

After an elapse of a predetermined time period, the back surface cleaning nozzle 260R discharges the rinse liquid to the back surface of the substrate W in place of the cleaning liquid. This causes the cleaning liquid supplied onto the substrate W to be cleaned away. Furthermore, after an elapse of a predetermined time period, the back surface cleaning nozzle 260R moves outward apart from the substrate W held by the spin chuck 201R after stopping to discharge the rinse liquid to the substrate W. The number of revolutions of the rotation shaft 203 increases. This causes a great centrifugal force to act on the rinse liquid remaining on the substrate W. Thus, a liquid that adheres to the back surface and the edge of the substrate W is scattered, so that the substrate W is dried.

In the back surface cleaning unit SDR, the cleaning liquid and the rinse liquid may be also supplied onto the substrate W by means of a soft spray method using a two-fluid nozzle that discharges a fluid mixture of a gas and a liquid. When the two-fluid nozzle is used, inert gas such as nitrogen gas ($N_2$), argon gas, or helium gas must be supplied, as indicated by a dotted line in FIG. 8, to the back surface cleaning nozzle 260R.

(5) As to the Reversing Unit

The reversing unit RT will be herein described in detail with reference to the drawings. Note that the operation of each of constituent elements in the reversing unit RT, described below, is controlled by the main controller (controller) 91 shown in FIG. 1.

(5-a) Configuration of the Reversing Unit

Figure 9:
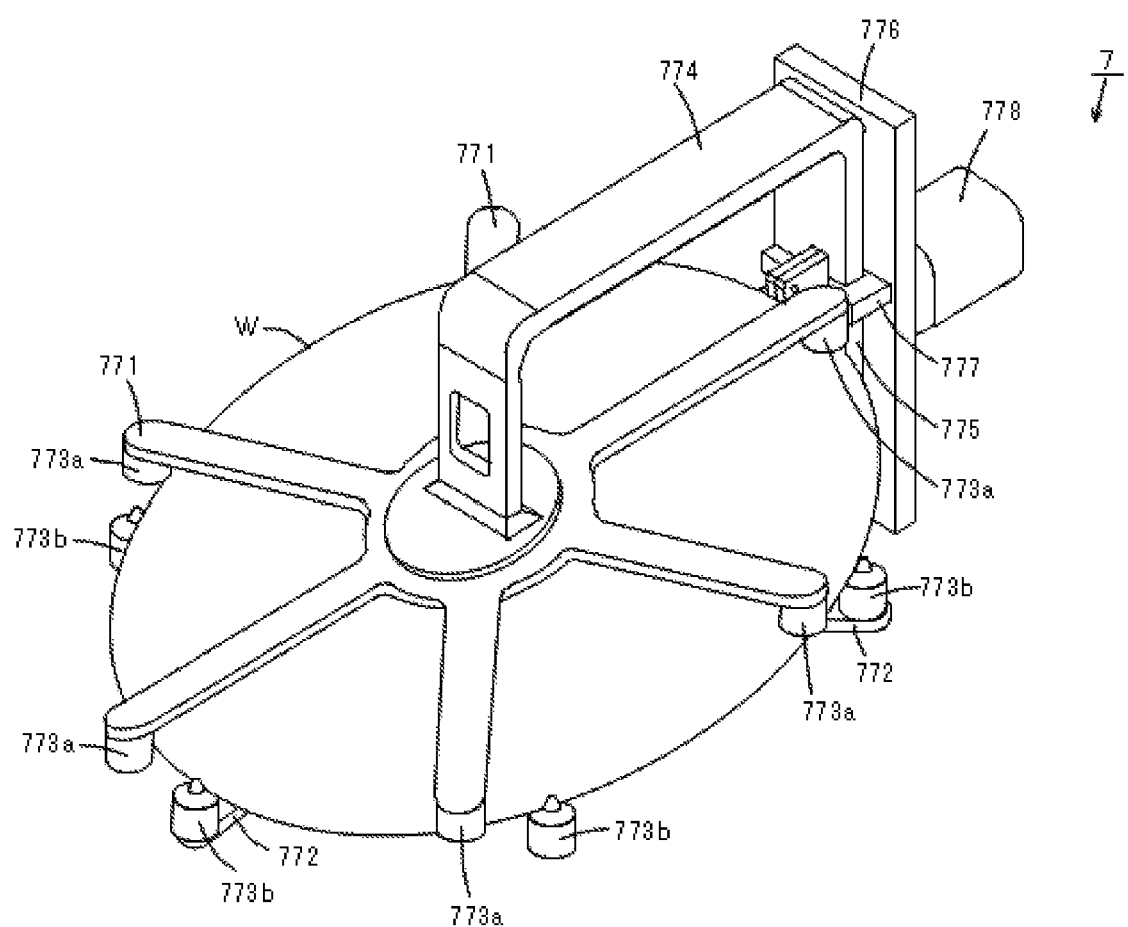
FIG. 9 is a perspective view showing the appearance of a substrate reversing device provided in a reversing unit.
Figure 10:
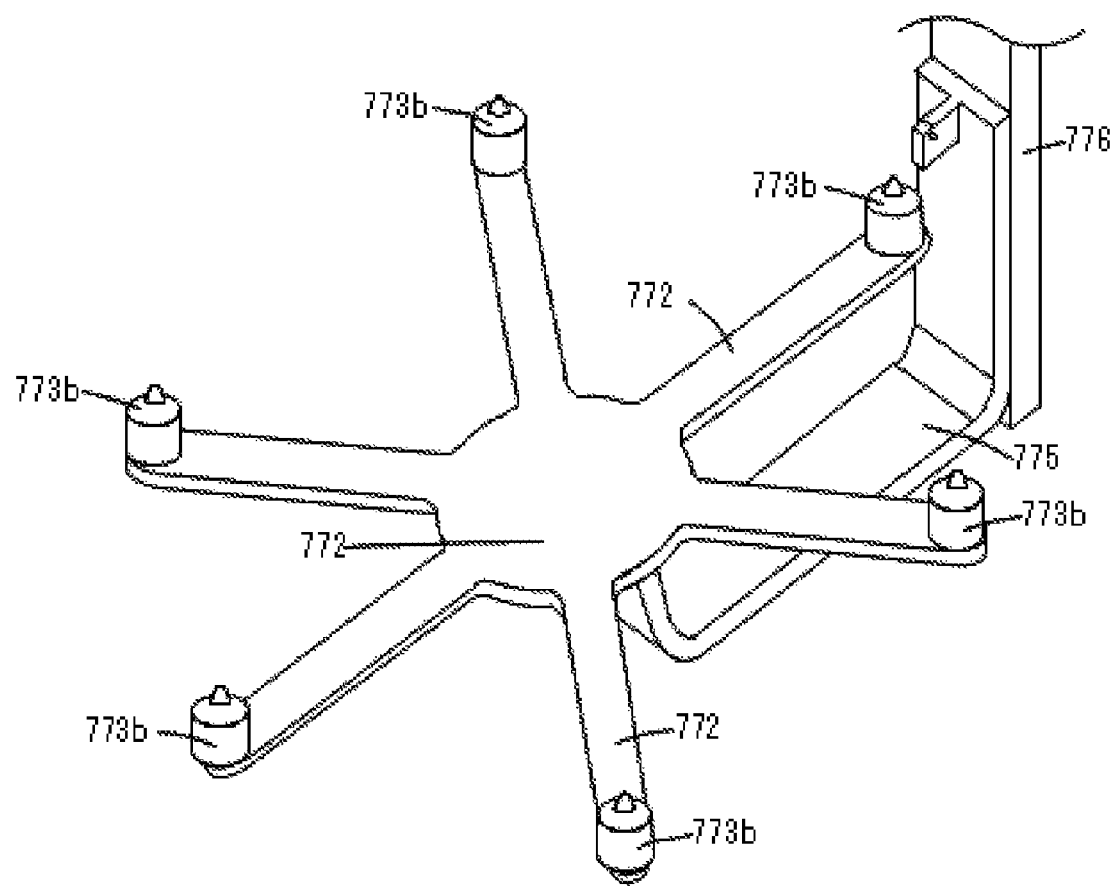
FIG. 10 is a perspective view showing the appearance of a part of the substrate reversing device.

FIG. 9 is a perspective view showing the appearance of a substrate reversing device 7 provided in the reversing unit RT, and FIG. 10 is a perspective view showing the appearance of a part of the substrate reversing device 7. As shown in FIGS. 9 and 10, the substrate reversing device 7 includes a first supporting member 771, a second supporting member 772, a plurality of substrate support pins 773a and 773b, a first movable member 774, a second movable member 775, a fixed plate 776, a rink mechanism 777, and a rotating mechanism 778.

As shown in FIG. 10, the second supporting member 772 is composed of six stick-shaped members radially extending. Each of the six stick-shaped members has the substrate support pin 773b provided at its tip. Similarly, as shown in FIG. 9, the first supporting member 771 is also composed of six stick-shaped members radially extending. Each of the six stick-shaped members has the substrate support pin 773a provided at its tip.

Although in the present embodiment, each of the first and second supporting members 771 and 772 is composed of six stick-shaped members, the present invention is not limited to the same. Each of the first and second supporting members 771 and 772 may be composed of stick-shaped members in any other number or members in any other shape. For example, the first and second supporting members 771 and 772 may be respectively formed in other shapes such as disk shapes or polygonal shapes having outer peripheries along the plurality of first and second substrate support pins 773a and 773b.

The first movable member 774 has a U shape. The first supporting member 771 is fixed to one end of the first movable member 774. The other end of the first movable member 774 is connected to the link mechanism 777. Similarly, the second movable member 775 has a U shape. The second supporting member 772 is fixed to one end of the second movable member 775. The other end of the second movable member 775 is connected to the link mechanism 777. The link mechanism 777 is attached to a rotation axis of the rotating mechanism 778. The link mechanism 777 and the rotating mechanism 778 are attached to the fixed plate 776.

The link mechanism 777 shown in FIG. 9 contains an air cylinder or the like, which allows the first movable member 774 and the second movable member 775 to move to a relatively spaced state and a closely-spaced state. Furthermore, the rotating mechanism 778 shown in FIG. 9 contains a motor or the like, which allows the first movable member 774 and the second movable member 775 to rotate through an angle of 180 degrees, for example, about a horizontal axis through the link mechanism 777.

(5-b) Operations of the Reversing Unit

Figure 11:
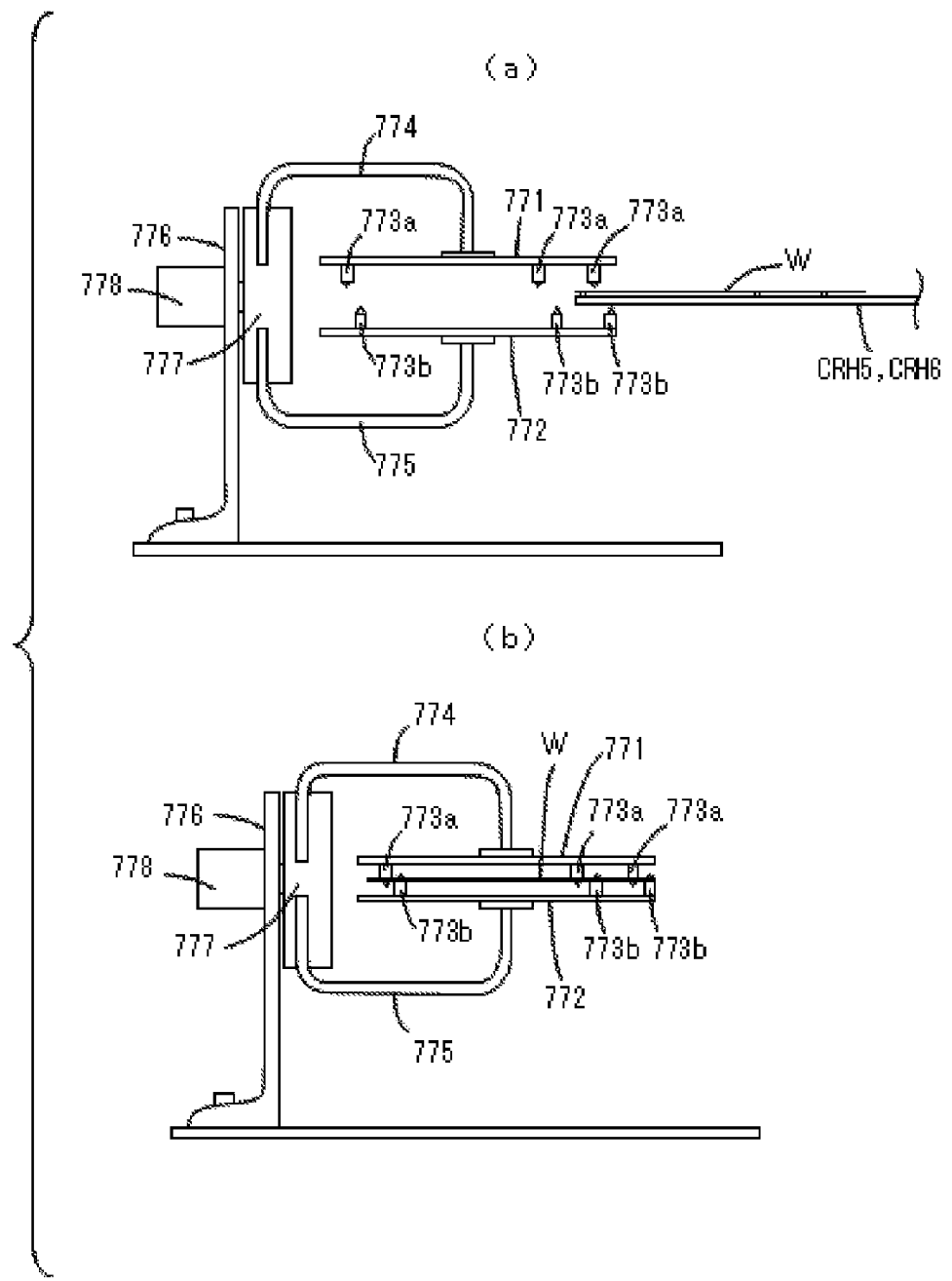
FIG. 11 is a schematic view showing the operations of the substrate reversing device shown in FIG. 9.
Figure 12:
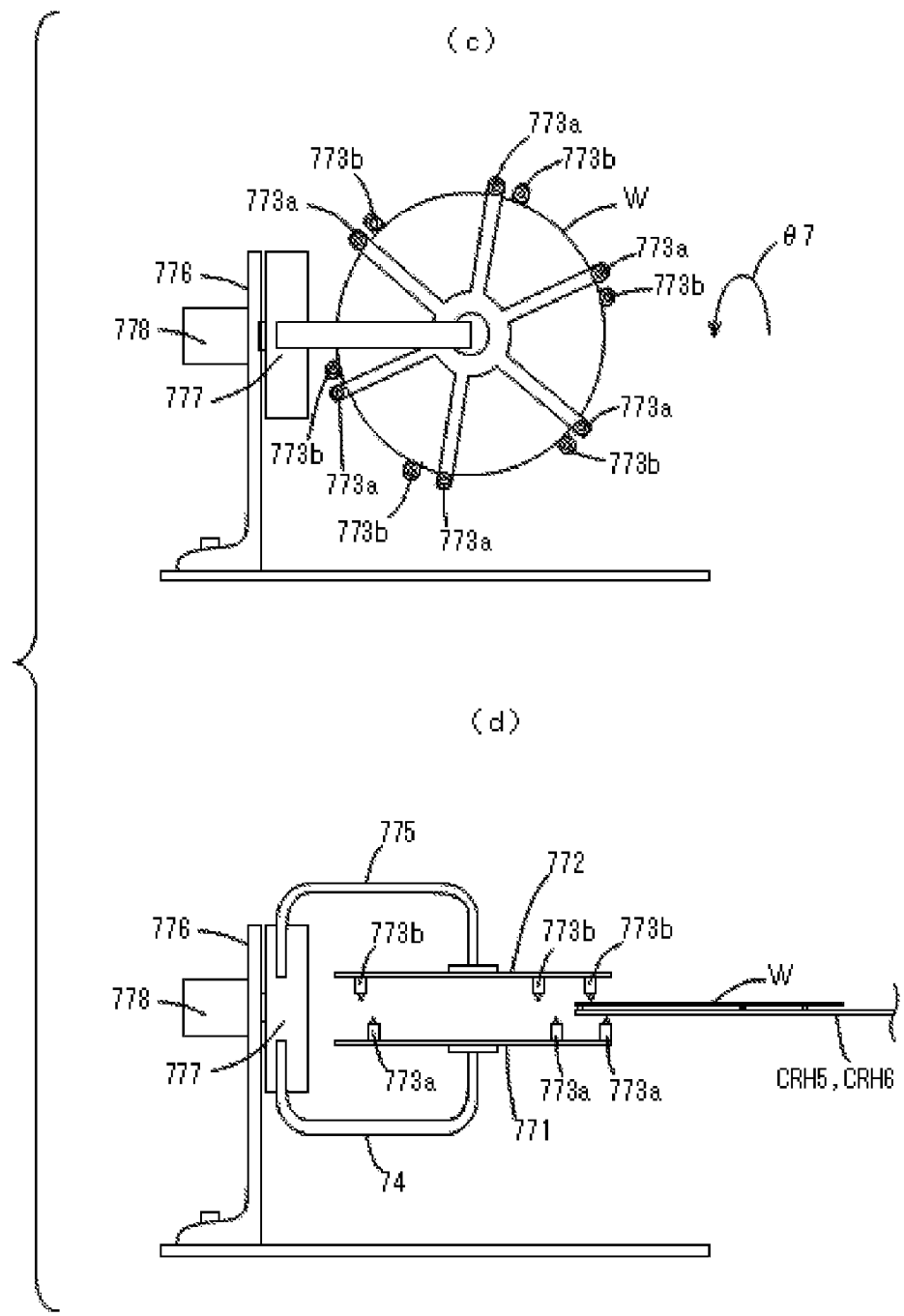
FIG. 12 is a schematic view showing the operations of the substrate reversing device shown in FIG. 9.

FIGS. 11 and 12 are schematic views showing the operations of the substrate reversing device 7 shown in FIG. 9. First, as shown in FIG. 11(a), the second central robot CR2 shown in FIG. 1 carries the substrate W into the substrate reversing device 7. In this case, the action of the link mechanism 777 causes the first movable member 774 and the second movable member 775 to be held in a vertically spaced state. The hands CRH5 and CRH6 of the second central robot CR2 transfer the substrate W onto the plurality of substrate support pins 773b in the second supporting member 772. After the substrate W is transferred, the hands CRH5 and CRH6 of the second central robot CR2 exit from the substrate reversing device 7. Then, as shown in FIG. 11(b), the action of the link mechanism 777 causes the first movable member 774 and the second movable member 775 to move to a vertically closely-spaced state.

Subsequently, as shown in FIG. 12(c), the action of the rotating mechanism 778 causes the first movable member 774 and the second movable member 775 to rotate through an angle of 180 degrees in a direction indicated by an arrow θ7 about a horizontal axis. In this case, the substrate W, together with the first movable member 774 and the second movable member 775, rotates through an angle of 180 degrees while being held by the plurality of substrate support pins 773a and 773b respectively provided in the first supporting member 771 and the second supporting member 772. Finally, the action of the link mechanism 777 causes the first movable member 774 and the second movable member 775 to move to a vertically spaced state. The hands CRH5 and CRH6 of the second central robot CR2 enter the substrate reversing device 7, and exit therefrom with the substrate W held, as shown in FIG. 12(d).

(6) Effects (6-a) First Effect of the Cleaning Processing

In the substrate processing apparatus 500 according to the present embodiment, the top surface and edge cleaning/drying unit SD in the second cleaning/drying processing group 121 in the cleaning/drying processing block 12 subjects the substrate W before the exposure processing to the top surface and edge cleaning processing. This causes the top surface and the edge of the substrate W carried into the exposure device 15 to be kept clean.

The back surface cleaning unit SDR in the first cleaning/drying processing group 120 in the cleaning/drying processing block 12 subjects the substrate W before the exposure processing to the back surface cleaning processing. This causes the back surface of the substrate W carried into the exposure device 15 to be kept clean. As a result, contamination in the exposure device 15 due to contamination on the top surface, the edge, and the back surface of the substrate W before the exposure processing can be prevented, which can more sufficiently prevent a defective dimension and a defective shape of an exposure pattern.

Although the back surface of the substrate W is held by suction on the spin chuck 201 (FIG. 4) during the top surface and edge cleaning processing, the back surface cleaning processing is quickly performed after the top surface and edge cleaning processing. Therefore, suction marks on the back surface of the substrate W is easily removed.

(6-b) Second Effect of the Cleaning Processing

In the substrate processing apparatus 500 according to the present embodiment, the top surface and the edge of the substrate W can be concurrently or simultaneously cleaned within the top surface and edge cleaning/drying unit SD. This eliminates the necessity of individually cleaning the top surface and the edge of the substrate W before the exposure processing is eliminated, which prevents throughput in substrate processing from being reduced.

Furthermore, the top surface cleaning unit for cleaning the top surface of the substrate W and the edge cleaning unit for cleaning the edge of the substrate W need not be individually provided. This causes the cleaning/drying processing block 12 to be miniaturized. Furthermore, throughput in substrate processing can be also further improved by increasing the number of top surface and edge cleaning/drying units SD provided in the cleaning/drying processing block 12. Furthermore, another processing unit can be also provided in the second cleaning/drying processing group 121 in the cleaning/drying processing block 12.

(6-c) First Effect of the Arrangement of the Reversing Unit

As described in the foregoing, in the cleaning/drying processing block 12, the plurality of top surface and edge cleaning/drying units SD and the plurality of back surface cleaning units SDR are provided so as to be opposite to each other with the second central robot CR2 interposed therebetween. Furthermore, the two reversing units RT are respectively stacked above and below the substrate platforms PASS5 and PASS6 arranged in the cleaning/drying processing block 12.

In the cleaning/drying processing block 12, the top surface and edge cleaning/drying units SD, the back surface cleaning units SDR, the reversing units RT are provided so as to surround the second central robot CR2. This allows the second central robot CR2 to quickly transport the substrate W between the top surface and edge cleaning/drying unit SD and the reversing unit RT and between the back surface cleaning unit SDR and the reversing unit RT by rotating through an angle of 90 degrees in the ±θ direction as well as moving up and down.

Thus, the transport distance of the substrate W among the units SD, SDR, and RT becomes shorter, as compared with that in a case where the plurality of processing blocks are respectively provided with the top surface and edge cleaning/drying units SD, the back surface cleaning units SDR, and the reversing units RT, so that a time period required to transport the substrate W is shortened. As a result, throughput in substrate processing of the whole substrate processing apparatus can be sufficiently improved.

(6-d) Second Effect of the Arrangement of the Reversing Unit

The reversing units RT are respectively stacked above and below the substrate platforms PASS5 and PASS6 positioned between the cleaning/drying processing block 12 and the development processing block 13. Thus, in the substrate processing apparatus 500, a new block for the reversing unit RT need not be provided. Therefore, the substrate processing apparatus 500 is prevented from getting larger in size in the Y direction.

Furthermore, the reversing unit RT need not be provided within a processing section in each of the blocks 10 to 14, which eliminates the necessity of reducing the number of units to be inherently provided within the processing section in each of the blocks 10 to 14 in order to provide the reversing unit RT. This prevents throughput in substrate processing from being reduced.

(7) Modification and its Effect (7-a) Configuration of the Interface Block

In the present embodiment, when the exposure device 15 subjects the substrate W to the exposure processing using the liquid immersion method, a post-exposure cleaning/drying unit DRY may be provided in the interface block 14, as indicated by a dotted line in FIG. 1.

The post-exposure cleaning/drying unit DRY includes a spin chuck (not shown) for rotating the substrate W with the substrate W held in a horizontal attitude by suction, and a nozzle (not shown) for supplying a processing liquid for cleaning (a cleaning liquid and a rinse liquid) to the substrate W held on the spin chuck. Thus, the post-exposure cleaning/drying unit DRY cleans the top surface of the substrate W by supplying the processing liquid to the top surface of the substrate W from the nozzle, and then rotates the substrate W after the cleaning processing. This causes the liquid that adheres to the substrate W to be scattered while causing the top surface of the substrate W to be dried.

The substrate W after the exposure processing is thus subjected to the cleaning and drying processing, so that the liquid that has adhered to the substrate W during the exposure processing is prevented from dropping in the substrate processing apparatus 500, which can prevent operational problems such as abnormalities in an electric system of the substrate processing apparatus 500. As a result, processing defects in the substrate W are prevented.

(7-b) Another Example of Operations

In the present embodiment, the first and second cleaning/drying processing groups 120 and 121 may clean the substrate W after the exposure processing and after the development processing. In this case, the second central robot CR2 in the cleaning/drying processing block 12 receives the substrate W before the exposure processing from the substrate platform PASS3, and places the substrate W on the substrate platform PASS5.

Furthermore, the second central robot CR2 transports, when it receives the substrate W after the exposure processing and after the development processing from the substrate platform PASS6, the substrate W among the first cleaning/drying processing group 120, the second cleaning/drying processing group 121, and the reversing unit RT. This causes the whole surface of the substrate W to be cleaned. Thereafter, the second central robot CR2 places the substrate W on the substrate platform PASS4.

In addition thereto, the first and second cleaning/drying processing groups 120 and 121 may clean the substrates W after the exposure processing and before the development processing. In this case, the clean substrate W after the exposure processing is carried into the development processing unit DEV. This prevents development defects due to contamination in the substrate W after the development processing.

(7-c) Another Example of Arrangement

In the present embodiment, the cleaning/drying processing block 12 and the development processing block 13 may be replaced with each other. In this case, in the substrate processing apparatus 500, the indexer block 10, the resist film processing block 11, the development processing block 13, the cleaning/drying processing block 12, and the interface block 14 are provided side by side in this order.

In this case, the first cleaning/drying processing group 120 and the second cleaning/drying processing group 121 can quickly clean the top surface, the back surface, and the edge of the substrate W after the exposure processing carried out of the exposure device 15. This causes throughput in substrate processing to be improved while causing development defects due to contamination in the substrate W after the development processing.

(7-d) As to the Resist Cover Film

In the above-mentioned substrate processing apparatus 500, when the resist film formed on the top surface of the substrate W and the liquid used by the liquid immersion method in the exposure device 15 are brought into contact with each other so that a component of a resist is easily eluted in the liquid, a new processing block (a resist cover film formation block) for forming a resist cover film for protecting the resist film may be provided. In this case, the resist cover film prevents the component of the resist from being eluted in the liquid during the exposure processing by the exposure device 15.

When the resist cover film processing block is provided, a new processing block for removing the resist cover film (a resist cover film removal block) after the exposure processing by the exposure device 15 and before the development processing by the development processing group 60 in the development processing block 13 must be provided. In this case, the development processing is accurately and reliably performed.

(7-e) As to the Anti-Reflection Film

In the above-mentioned substrate processing apparatus 500, a new processing block for forming an anti-reflection film (an anti-reflection film processing block) may be provided on the substrate W. In this case, standing waves and halation generated during the exposure processing can be reduced by forming the anti-reflection film on the top surface of the substrate W before forming the resist film.

(7-f) As to the Exposure Device

In the above-mentioned embodiments, the exposure device 15 may subject the substrate W to the exposure processing without using the liquid immersion method. In this case, the object of the present invention can be also achieved by providing the back surface cleaning unit SDR and the reversing unit RT in the substrate processing apparatus 500.

(7-g) Others

In order to previously elude or deposit the component of the film on the substrate W, it is preferable that a liquid used for the liquid immersion method (an immersion liquid) in the exposure device 15 is used as the cleaning liquid used in the above-mentioned top surface and edge cleaning processing. Examples of the immersion liquid include pure water, glycerol with a high refractive index, a liquid mixture of fine particles with a high refractive index (e.g., aluminum oxide) and pure water, and an organic liquid. Other examples of the immersion liquid include a pure water solution containing a complex (ionized), carbonic water, hydrogen water, electrolytic ionic water, HFE (hydrofluoroether), hydrofluoric acid, sulfuric acid, and a sulfuric acid/hydrogen peroxide mixture.

(8) Correspondences between Elements in the Claims and Parts in Embodiments

In the following paragraphs, non-limiting examples of correspondences between various elements recited in the claims below and those described above with respect to various preferred embodiments of the present invention are explained.

In the embodiments described above, the resist film processing block 11, the cleaning /drying processing block 12, and the development processing block 13 are examples of a processing section, the interface block 14 is an example of an interface, the resist film processing block 11 is an example of a first processing unit, the cleaning/drying processing block 12 is an example of a second processing unit, and the development processing block 13 is an example of a third processing unit.

The resist film coating processing group 40 is an example of a photosensitive film formation region, an installation region of the first central robot CR1 is an example of a first transport region, the coating unit RES is an example of a photosensitive film formation unit, and the first central robot CR1 is an example of a first transport unit.

Furthermore, the first and second cleaning/drying processing groups 120 and 121 are examples of a cleaning region, an installation region of the second central robot CR2 is an example of a second transport region, the top surface and edge cleaning/drying unit SD is an example of a top surface cleaning unit, and the second central robot CR2 is an example of a second transport unit.

The development processing group 60 is an example of a development processing region, an installation region of the third central robot CR3 is an example of a third transport region, the development processing unit DEV is an example of a development unit, and the third central robot CR3 is an example of a third transport unit.

Furthermore, the substrate platforms PASS and PASS4 are examples of a first placement unit, the substrate platforms PASS5 and PASS6 are examples of a second placement unit, the first cleaning/drying processing group 120 is an example of a first cleaning region, and the second cleaning/drying processing group 121 is an example of a second cleaning region.

As the elements recited in the claims, various other elements having the structure or function recited in the claims may be employed.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus arranged adjacent to an exposure device, the substrate processing apparatus being configured to process a substrate having a top surface and a back surface, the substrate processing apparatus comprising:
   a processing section configured to subject the substrate to predetermined processing, wherein the processing section includes a first processing unit, a second processing unit, and a third processing unit, wherein
      the first processing unit includes a photosensitive film formation region and a first transport region, wherein the photosensitive film formation region comprises a photosensitive film formation unit configured to form a photosensitive film including a photosensitive material on the top surface of substrate prior to exposure processing by the exposure device, and wherein the first transport region comprises a first transport unit configured to transport the substrate;
      the second processing unit includes a cleaning region and a second transport region, wherein the cleaning region comprises a top surface cleaning unit configured to clean the top surface of the substrate and a back surface cleaning unit configured to clean the back surface of the substrate, and wherein the second transport region comprises a second transport unit configured to transport the substrate; and
      the third processing unit includes a development processing region and a third transport region, wherein the development processing region comprises a development unit configured to subject the substrate to development processing after exposure processing by the exposure device; and wherein the third transport region comprises a third transport unit configured to transport the substrate;
   an interface configured to receive and transfer the substrate between the processing section and the exposure device, wherein:
   a first placement unit disposed between the first processing unit and the second processing unit and configured to receive the substrate after transportation by the first and second transport units;
   a second placement unit disposed between the second processing unit and the third processing unit and configured to receive the substrate after transportation by the second and third transport units; and
   a reversing unit that is stacked on at least one of the first placement unit or the second placement unit, the reversing unit being configured to reverse one surface and the other surface of the substrate after transportation of the substrate by the second transport unit; and wherein
   the second transport unit carries the substrate after the formation of the photosensitive film by the photosensitive film formation unit and before the exposure processing by the exposure device into the top surface cleaning unit, with the top surface of the substrate being directed upward, and carries the substrate after the cleaning by the top surface cleaning unit and before the exposure processing by the exposure device into the back surface cleaning unit, with the top surface of the substrate being directed downward,
   the top surface cleaning unit includes;
   a first substrate holder that sucks the back surface of the substrate and hold the substrate in a substantially horizontal attitude,
   a first rotation driver, that rotates the substrate held by the substrate holder about and axis perpendicular to the substrate, and
   a first processing liquid supplier that supplies a processing liquid onto the top surface of the substrate that is held by the first substrate holder and is rotated, and
   the back surface cleaning unit includes;
   a second substrate holder that holds the substrate in a substantially horizontal attitude by holding an outer peripheral portion of the substrate,
   a second rotation driver that rotates the substrate held by the second substrate holder about an axis perpendicular to the substrate, and
   a second processing liquid supplier that supplies a processing liquid onto the back surface of the substrate that is held by the second substrate holder and is rotated.

2. The substrate processing apparatus of claim 1 wherein the cleaning region further comprises a first cleaning region arranged opposite to a second cleaning region.

3. The substrate processing apparatus of claim 2 wherein the second transport region is interposed between the first cleaning region and the second cleaning region.

4. The substrate processing apparatus of claim 2 wherein:
   the first cleaning region includes the top surface cleaning unit;
   the second cleaning region includes the back surface cleaning unit; and
   the second transport unit is configured such that the substrate can be transported among the top surface cleaning unit, the back surface cleaning unit, the first placement unit, the second placement unit, and the reversing unit.

5. The substrate processing apparatus of claim 1 wherein the photosensitive material comprises photoresist.

6. The substrate processing apparatus of claim 1 wherein the top surface cleaning unit is configured to concurrently clean the top surface and an edge of the substrate.

7. The substrate processing apparatus of claim 1 wherein the exposure device comprises a liquid immersion exposure device.

8. The substrate processing apparatus of claim 1 further comprising a new processing block for forming an anti-reflection film on the substrate.

* * * * *